(12) United States Patent
Park

(10) Patent No.: US 9,337,287 B2
(45) Date of Patent: May 10, 2016

(54) NON-VOLATILE MEMORY DEVICE

(71) Applicant: SK hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 211 days.

(21) Appl. No.: 14/135,141

(22) Filed: Dec. 19, 2013

(65) Prior Publication Data

US 2015/0069486 A1     Mar. 12, 2015

(30) Foreign Application Priority Data

Sep. 6, 2013 (KR) .......................... 10-2013-0107440

(51) Int. Cl.
     *H01L 29/788*     (2006.01)
     *H01L 29/423*     (2006.01)
     *H01L 27/115*     (2006.01)

(52) U.S. Cl.
     CPC .... *H01L 29/42328* (2013.01); *H01L 27/11521* (2013.01); *H01L 29/7881* (2013.01)

(58) Field of Classification Search
     CPC .................. H01L 27/11517; H01L 27/11524; H01L 29/66825; H01L 29/42328; H01L 29/7881; H01L 27/11521

USPC ........................................... 257/316, 319, 320
See application file for complete search history.

(56) References Cited

U.S. PATENT DOCUMENTS

| 7,800,158 | B2 | 9/2010 | Jeon et al. | |
|---|---|---|---|---|
| 2007/0267684 | A1* | 11/2007 | Jeon | H01L 27/115 257/315 |
| 2008/0017917 | A1* | 1/2008 | Lin | H01L 21/76829 257/321 |

FOREIGN PATENT DOCUMENTS

| KR | 1019960012483 | 4/1996 |
|---|---|---|
| KR | 1020140069854 | 6/2014 |
| KR | 1020140081398 | 7/2014 |

* cited by examiner

*Primary Examiner* — John C Ingham
*Assistant Examiner* — Frederick B Hargrove
(74) *Attorney, Agent, or Firm* — IP & T Group LLP

(57) ABSTRACT

A non-volatile memory device includes an isolation layer formed over a substrate to define an active region, a floating gate formed over the substrate, a selection gate formed over the substrate on one side of the floating gate and formed to be adjacent to the floating gate with a first gap from the floating gate, a control plug formed over the isolation layer on the other side of the floating gate and formed to be adjacent to the floating gate with a second gap from the floating gate, and a charge blocking layer formed to gap-fill the first gap and the second gap.

20 Claims, 16 Drawing Sheets

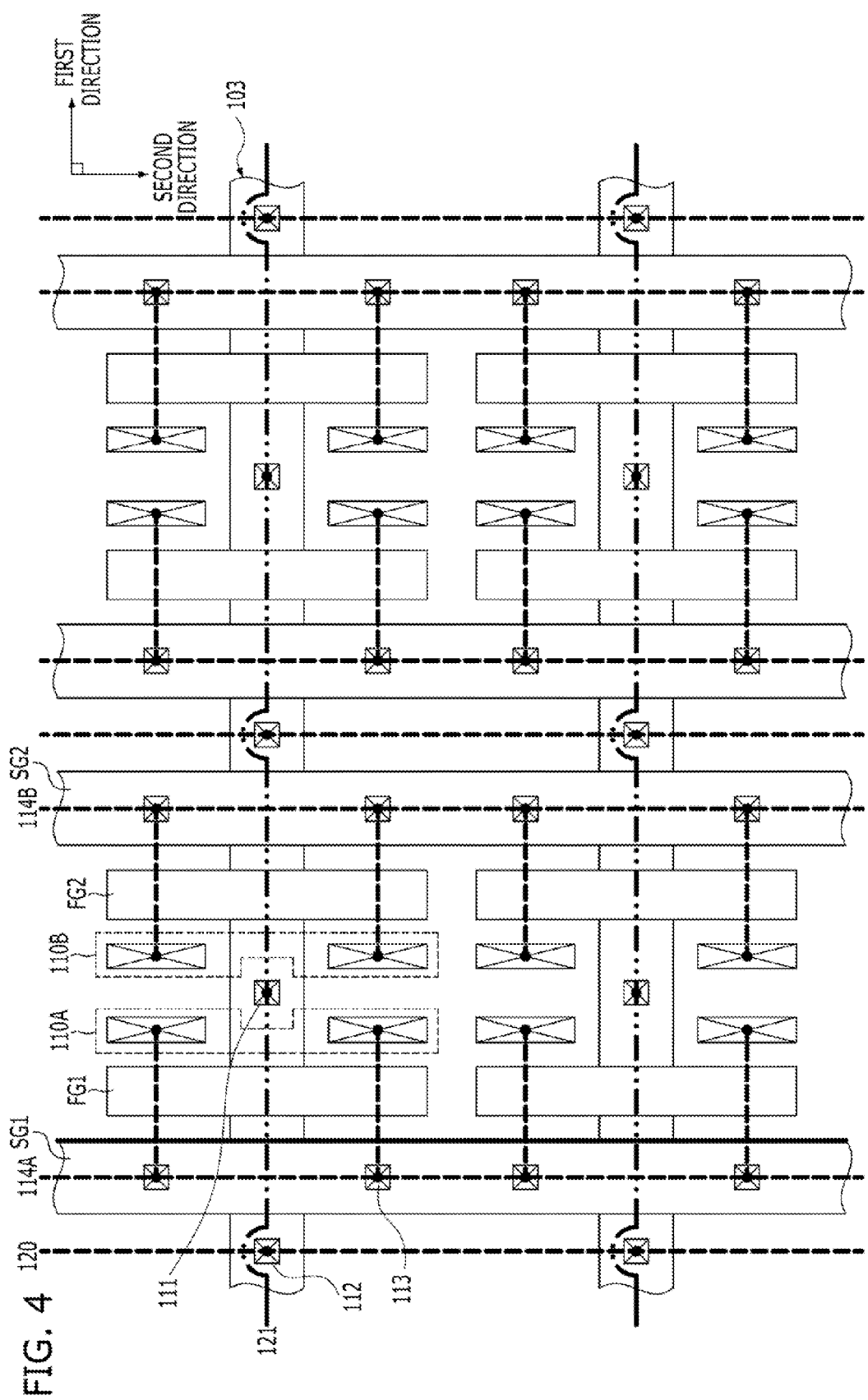

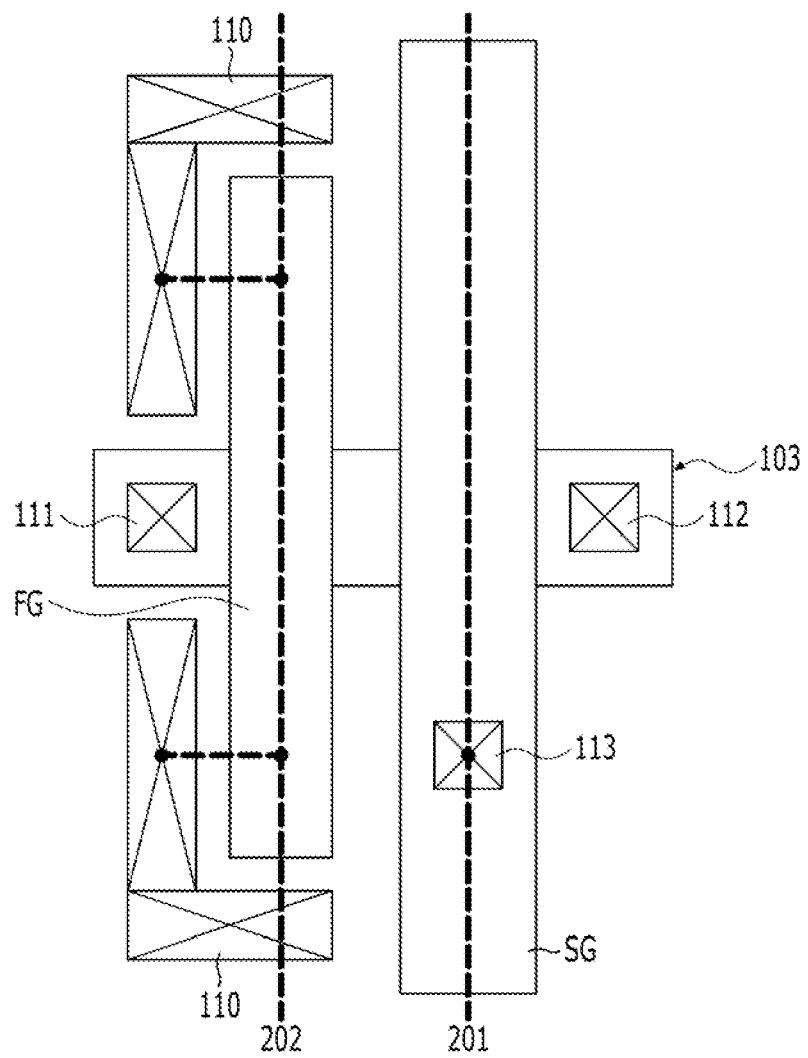

NON-VOLATILE MEMORY DEVICE

CROSS-REFERENCE TO RELATED APPLICATIONS

The present application claims priority of Korean Patent Application No. 10-2013-0107440, filed on Sep. 6, 2013, which is incorporated herein by reference in its entirety.

BACKGROUND

1. Field

Exemplary embodiments of the present invention relate to a semiconductor device fabrication technology, and more particularly, to a non-volatile memory device.

2. Description of the Related Art

Recent digital media devices allow people to readily use information anywhere and at any time. As analog devices give way to digital devices, diverse digital devices are rapidly proliferating and require storage media to store photograph images, recorded music, diverse data and so forth. Due to increasing demand, non-memory semiconductor industries are keeping pace with high integration tendencies and focusing on System on Chip (SoC) technology. Thus, global semiconductor companies are making investments and competing to enhance the SoC-based technology. SoC is a technology for integrating all system components in one semiconductor. Without system designing technologies, it may be difficult to develop non-memory semiconductors.

Recently, the need for an embedded memory for trimming an analog device or storing an internal operation algorithm is increasing significantly. Chips having a mixed function of a digital circuit and an analog circuit are emerging as a mainstream technology in the SoC field where complicated technologies are integrated.

Since the embedded memory is fabricated through a logic process or a complementary metal-oxide semiconductor "CMOS" process for forming a logic circuit, improving the operation characteristics and integration degree of the embedded memory is difficult. To solve this concern, that is, to improve the operation characteristics and integration degree of the embedded memory, it may be necessary to perform additional processes other than a predetermined logic process. However, the procedural variables appearing in the additional processes other than the predetermined logic process may deteriorate not only the characteristics of the embedded memory but also the characteristics of a device including the embedded memory.

SUMMARY

An exemplary embodiment of the present invention is directed to a non-volatile memory device that may be fabricated without performing a process in addition to a logic process.

Another exemplary embodiment of the present invention is directed to a non-volatile memory device that may have improved operation characteristics and integration degree.

In accordance with an exemplary embodiment of the present invention, a non-volatile memory device includes an isolation layer formed over a substrate to define an active region, a floating gate formed over the substrate, a selection gate formed over the substrate on one side of the floating gate and formed to be adjacent to the floating gate with a first gap from the floating gate, a control plug formed over the isolation layer on the other side of the floating gate and formed to be adjacent to the floating gate with a second gap from the floating gate, and a charge blocking layer formed to gap-fill the first gap and the second gap.

In accordance with another exemplary embodiment of the present invention, a non-volatile memory device includes an isolation layer formed over a substrate to define a plurality of active regions, a plurality of contact plugs formed over the active regions, a first floating gate and a second floating gate formed over the substrate on both sides of one contact plug selected among the contact plugs, a first selection gate and a second selection gate formed over the substrate on both sides of the selected contact plug wherein the first selection gate is formed to be adjacent to the first floating gate with a first gap from the first floating gate and the second selection gate is formed to be adjacent to the second floating gate with the first gap from the second floating gate, a first control plug and a second control plug formed over the isolation layer, between the first floating gate and the second floating gate, wherein the first control plug is formed to be adjacent to the first floating gate with a second gap from the first floating gate and the second control plug is formed to be adjacent to the second floating gate with the second gap from the second floating gate and wherein the first control plug and the second control plug are formed to be symmetrical to each other with respect to the contact plug selected, and a charge blocking layer formed on the sidewalls of the first floating gate, the second floating gate, the first selection gate, and the second selection gate and formed to gap-fill the first gap and the second gap.

BRIEF DESCRIPTION OF THE DRAWINGS

FIGS. 3 and 4 are plan views illustrating a cell array including the unit cell of the non-volatile memory device in accordance with the first embodiment of the present invention;

FIGS. 6A to 6C illustrate a unit cell of a non-volatile memory device in accordance with a modified example of the second embodiment of the present invention;

DETAILED DESCRIPTION

Figure 1A:
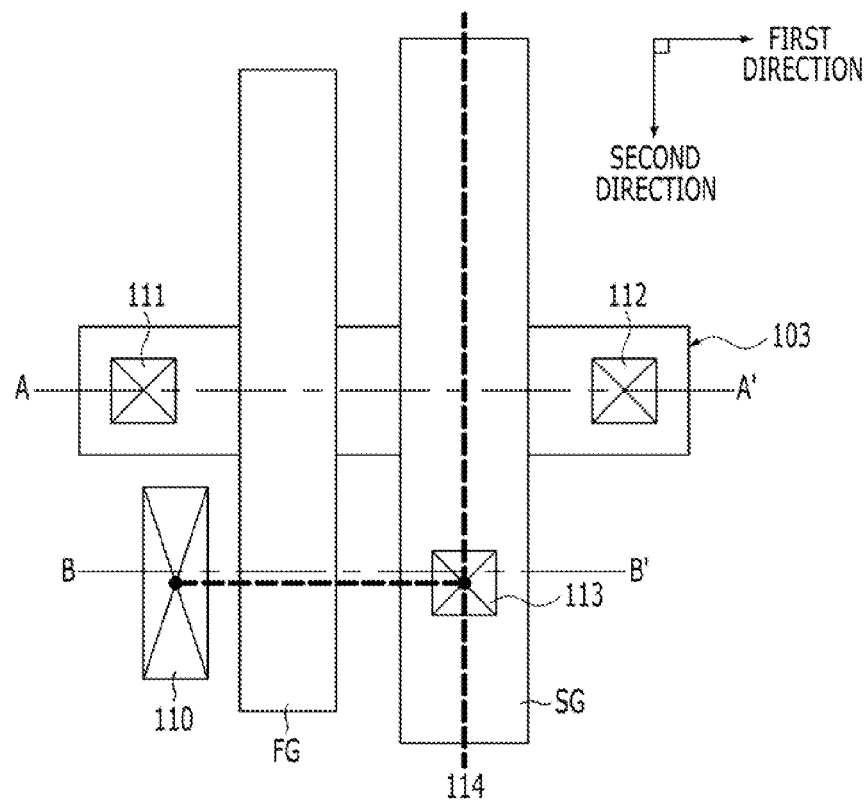
FIGS. 1A to 1D illustrate a unit cell of a non-volatile memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

The following embodiments of the present invention provide non-volatile memory devices having an embedded memory that is utilized in the field of SoC which integrates complicated technologies. The following embodiments of the present invention provide non-volatile memory devices that may be fabricated without an additional process in addition to a logic process, such as the fabrication of a single gate Electrically Erasable Programmable Read Only Memory (EEPROM) that is one of flash EEPROMs utilized among embedded memories, but may have an improved integration degree than the single gate EEPROM.

Herein, a flash EEPROM is a high-integration non-volatile memory device that may store a data even when the power is not supplied, just as a Read-Only Memory (ROM), and electrically program and erase the data. The EEPROM includes a single gate EEPROM having one gate, e.g., a floating gate, a stack gate EEPROM in which two gates, e.g., a floating gate and a control gate, are vertically stacked, a dual gate EEPROM which is a type between the single gate EEPROM and the stack gate EEPROM, and a split gate EEPROM. The typical single gate EEPROM does not require an additional process to be performed in addition to a logic process since it uses an impurity region, such as a well, formed in a substrate to couple a floating gate. However, the single gate EEPROM has a limitation for improving its operation characteristics and integration degree. On the contrary, the stack gate EEPROM in which a floating gate and a control gate are vertically stacked, the dual gate EEPROM in which a control gate and a floating gate are disposed in parallel, and the split gate EEPROM in which a control gate covers one side of a floating gate, each includes a control gate for coupling a floating gate. Therefore, the stack gate EEPROM, the dual gate EEPROM, and the split gate EEPROM may have improved operation characteristics and integration degree. However, since it is difficult to simultaneously form the floating gate and the control gate through the logic process it may be necessary to perform an additional process other than the logic process.

To solve this concern, the following embodiments of the present invention provide a non-volatile memory device that may be fabricated without performing an additional process other than a predetermined logic process and have improved operation characteristics and integration degree. For example, the non-volatile memory device of the present invention may include a floating gate, and a selection gate and a control plug, which function as a control gate for coupling the floating gate, and may be formed through a predetermined logic process.

In the following description, a first conductive type and a second conductive type are in a complementary relationship to each other. Specifically, when the first conductive type is a P-type, the second conductive type is an N-type. When the first conductive type is an N-type, the second conductive type is a P-type. This signifies that the non-volatile memory device in accordance with the embodiments of the present invention may be an N-channel type or a P-channel type. As an example, in the description, the first conductive type is a P-type and the second conductive type is an N-type. That is, a non-volatile memory device of an N-channel type is exemplarily described hereafter.

Figure 1B:
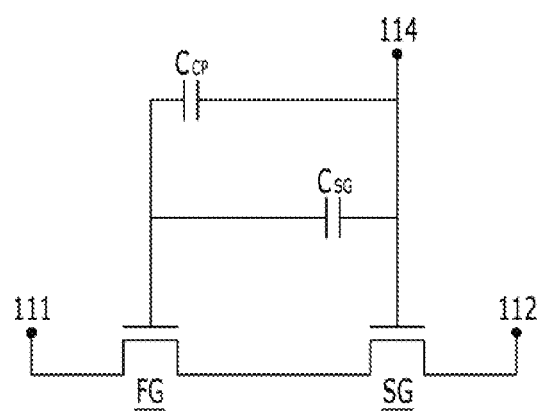
Figure 1C:
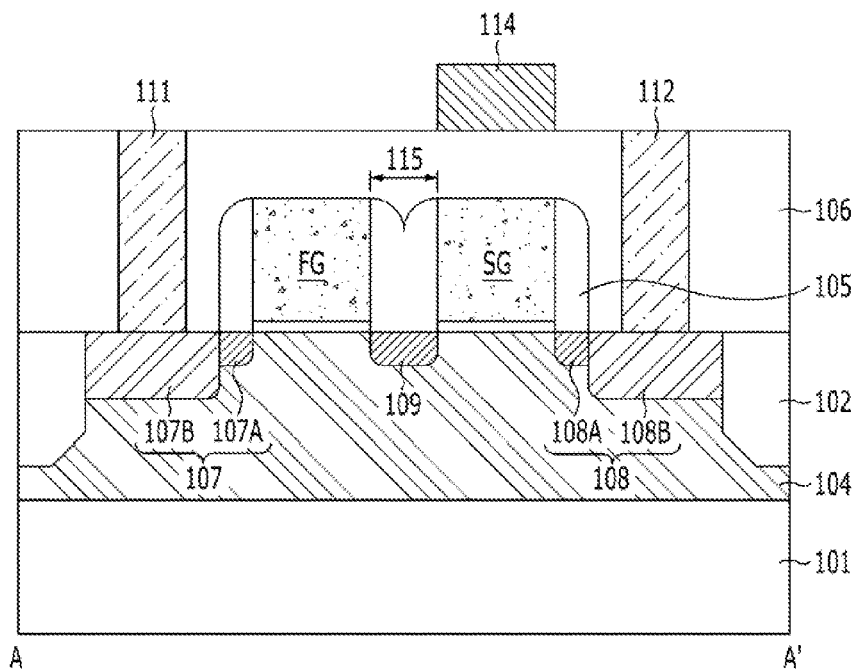
Figure 1D:
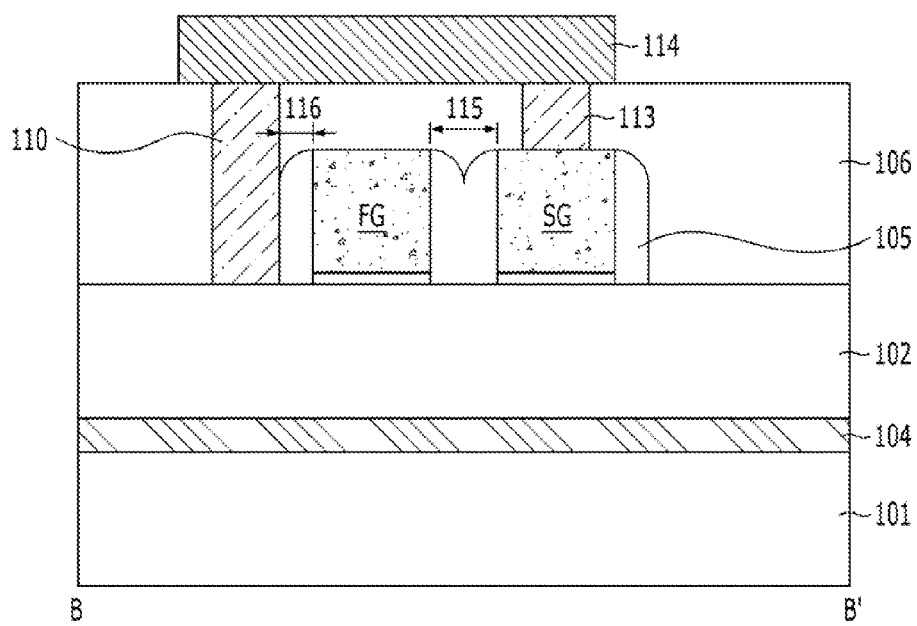
Figure 2A:
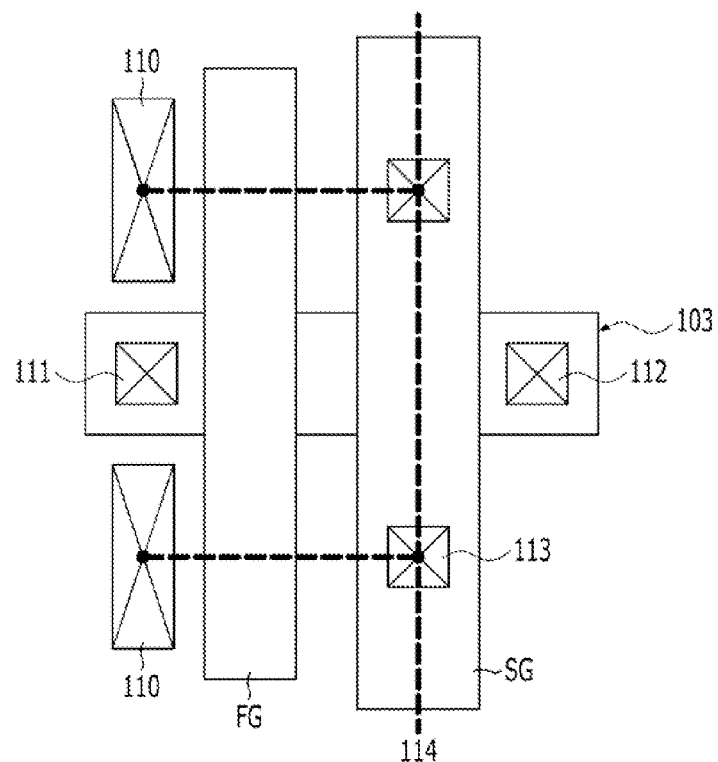
FIGS. 2A to 2C illustrate a unit cell of a non-volatile memory device in accordance with a modified example of the first embodiment of the present invention.
Figure 2B:
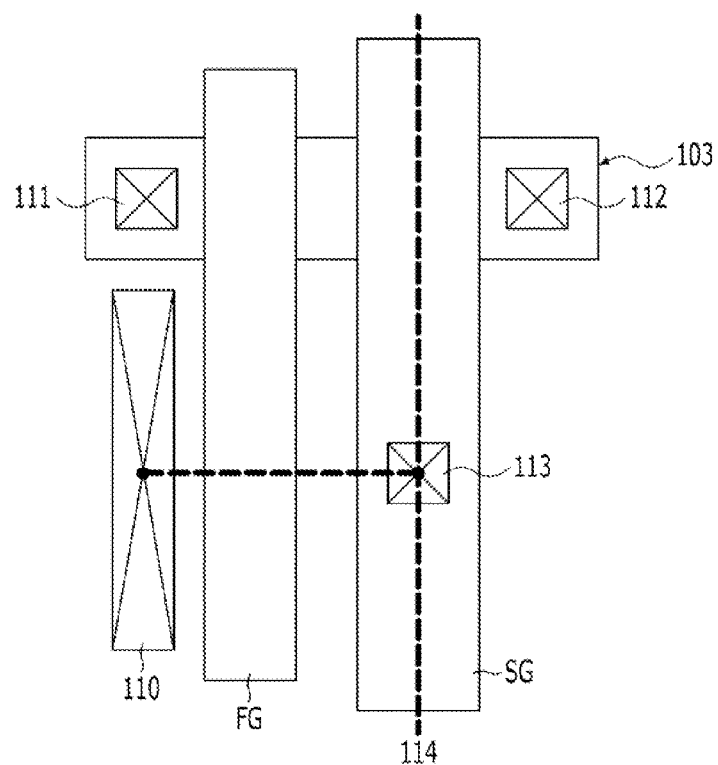
Figure 2C:
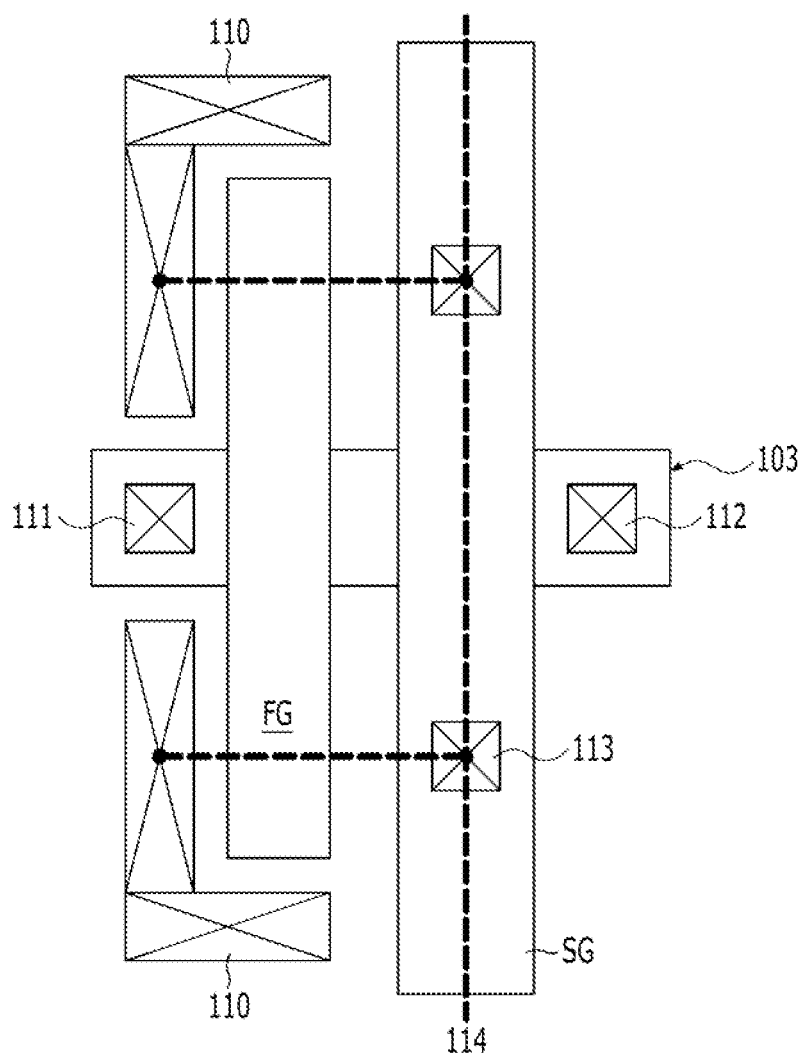

FIGS. 1A to 1D illustrate a unit cell of a non-volatile memory device in accordance with a first embodiment of the present invention, FIGS. 2A to 2C illustrate a unit cell of a non-volatile memory device in accordance with a modified example of the first embodiment of the present invention. Specifically, FIG. 1A is a plan view, and FIG. 1B is an equivalent circuit diagram, FIGS. 1C and 1D are cross-sectional views of the unit cell of FIG. 1A along a line A-A' and a line B-B' respectively.

Referring to FIGS. 1A to 1D, the non-volatile memory device in accordance with the first embodiment of the present invention may include an isolation layer 102, a floating gate FG, a selection gate SG, a control plug 110, and a charge blocking layer 105. The isolation layer 102 is formed over a substrate 101 and defines an active region 103. The floating gate FG is formed over the substrate 101. The selection gate SG is formed over the substrate 101 on one side of the floating gate FG with a first gap 115 from the floating gate FG. The control plug 110 is formed over the isolation layer 102 on the other side of the floating gate FG with a second gap 116 from the floating gate FG. The charge blocking layer 105 gap-fills the first gap 115 and the second gap 116.

Additionally, the non-volatile memory device in accordance with the first embodiment of the present invention may further include an inter-layer dielectric layer 106, a selection plug 113, and a conductive line 114. The inter-layer dielectric layer 106 is formed over the substrate 101. The selection plug 113 penetrates through the inter-layer dielectric layer 106 to couple with the selection gate SG. The control plug 110 penetrates through the inter-layer dielectric layer 106. The conductive line 114 is formed over the inter-layer dielectric layer 106 and couples the control plug 110 and the selection plug 113. The control plug 110 and the selection gate SG may receive the same bias voltage through the conductive line 114 during an operation, and the floating gate FG may be coupled in response to the bias voltage applied to the selection gate SG and the control plug 110. The term "coupling of the floating gate FG" means that an induced voltage generated by the bias voltage applied to the selection gate SG and the control plug 110, is applied to the floating gate FG.

The elements of the non-volatile memory device in accordance with the first embodiment of the present invention are now described.

The non-volatile memory device in accordance with the first embodiment of the present invention may further include a well 104 of the first conductive type that is formed over the substrate 101. The substrate 101 may be a semiconductor substrate. The semiconductor substrate may be of a monocrystalline state, and it may include a silicon-containing material. That is, the semiconductor substrate may include a monocrystalline silicon-containing material. For example, the substrate 101 may be a bulk silicon substrate, or a Silicon On Insulator (SOI) where a supportive substrate, a buried insulation layer, and a monocrystalline silicon layer are sequentially stacked. The well 104 provides a base on which a unit cell may operate. The well 104 may be formed by ion-implanting an impurity of the first conductive type into the substrate 101.

The non-volatile memory device in accordance with the first embodiment of the present invention may include the isolation layer 102 that is formed over the substrate 101 and defines an active region 103. The isolation layer 102 may be formed through a Shallow Trench Isolation (STI) process, and it may include an insulating substance. The active region 103 defined by the isolation layer 102 may be of a line type or a bar type having a long axis in a in first direction and a short axis in a second direction crossing or orthogonal to, the first direction. Junction regions 107 and 108 are disposed on the edge of both sides of the active region 103 in the first direction. The active region 103 may further include a protrusion (not shown) protruded in the second direction to improve contact characteristics e.g., contact area, between the junction regions 107 and 108 and contact plugs 111 and 112.

The non-volatile memory device in accordance with the first embodiment of the present invention may include the floating gate FG that is formed over the substrate 101 and the selection gate SG that is formed over the substrate 101 on one side of the floating gate FG with the first gap 115 from the floating gate F. The floating gate FG stores logic information, and the selection gate SG couples the floating gate FG while preventing over-erase. Thus the selection gate SG may have at least one sidewall facing the sidewall of the floating gate FG. As the area of the sidewalls of the selection gate SG and the floating gate FG facing each other increases, the coupling ratio between them may be raised, therefore the integration degree of the non-volatile memory device may easily be improved. The selection gate SG and the floating gate FG may have diverse geometrical shapes, to improve the coupling ratio.

The floating gate FG and the selection gate SG may have a line shape or a bar shape having its long axis extended in the second direction by simultaneously crossing the active region 103 and the isolation layer 102. That is, the floating gate FG and the selection gate SG may have a shape overlapping the active region 103 and may be extended in the second direction.

The floating gate FG and the selection gate SG may be stacked structures in which a gate insulation layer and a gate electrode are stacked, and they may be formed simultaneously. The gate insulation layer may be a single layer selected from the group consisting of an oxide layer, a nitride layer, and an oxynitride layer, or a stacked layer thereof. The gate electrode may include a silicon-containing material layer, e.g., a polysilicon layer. The polysilicon layer may be a doped polysilicon layer that is doped with an impurity, or an undoped polysilicon layer that is not doped with any impurity. Although FIGS. 1C and 1D illustrate that the floating gate FG and the selection gate SG have a planar gate structure, the floating gate FG and the selection gate SG may have a three-dimensional gate structure, such as a recess gate structure or a fin gate structure.

The non-volatile memory device in accordance with the first embodiment of the present invention may include a first junction region 107, a second junction region 108, and a third junction region 109. The first junction region 107 is formed in the active region 103 adjacent to the floating gate FG. The second junction region 108 is formed in the active region 103 adjacent to the selection gate SG. The third junction region 109 is formed between the floating gate FG and the selection gate SG, that is, in the active region 103 under the first gap 115. The first junction region 107, the second junction region 108, and the third junction region 109 may be impurity regions that are formed by ion-implanting an impurity of the second conductive type. The first junction region 107 and the second junction region 108 serve as a source region and a drain region, and they may have a Lightly Doped Drain (LDD) structure. Specifically, the first junction region 107 may include a first impurity region 107A of the second conductive type and a second impurity region 107B the second conductive type, and the second junction region 108 may include a first impurity region 108A of the second conductive type and a second impurity region 108B of the second conductive type. The impurity doping concentration of the second impurity regions 107B and 108B may be higher than the impurity doping concentration of the first impurity regions 107A and 108A. The third junction region 109 electrically connects a channel induced in the active region 103 by the floating gate FG and the selection gate G. The third junction region 109 may have the same conductive type and impurity doping concentration as the first impurity regions 107A and 108A. That is, the third junction region 109 may be simultaneously formed when the first impurity region 107A and 108A is formed. The third junction region 109 may alleviate the electric field between the first junction region 107 and the second junction region 108 since the third junction region 109 has a relatively lower impurity doping concentration than the impurity doping concentrations of the first junction region 107 and the second junction region 108. Therefore, the channel induced in the active region 103 by the selection gate SG and the floating gate FG may be effectively connected.

The non-volatile memory device in accordance with the first embodiment of the present invention may include the control plug 110 that is formed over the isolation layer 102 on the other side of the floating gate FG with the second gap 116 from the floating gate FG. The control plug 110 may include at least one plug having a sidewall facing a sidewall of the floating gate FG. For example, the control plug 110 may include a single plug having at least one sidewall facing the sidewall of the floating gate FG (refer to FIGS. 1A and 2B), or a plurality of plugs each having at least one sidewall facing the sidewall of the floating gate FG (refer to FIGS. 2A and 2C). The control plug 110 formed over the isolation layer 102 performs a function of coupling the floating gate FG during an operation along with the selection gate SG. Since the control plug 110 is disposed over the isolation layer 102, the degree of freedom with respect to the bias voltage applied to the control plug 110 may be improved while easily acquiring process margin. That is, since the control plug 110 is disposed over the isolation layer 102, the control plug 110 is free from the polarity (positive or negative) of the bias voltage applied thereto. Additionally, since the control plug 110 couples the floating gate FG in cooperation with the selection gate SG, the integration degree of the non-volatile memory device may be improved more effectively. As the area of the sidewalls of the control plug 110 and the floating gate FG facing each other is increased, the coupling ratio between them may be raised, and thus the integration degree of the non-volatile memory device may easily be improved. To improve coupling ratio, the control plug 110 and the floating gate FG may have diverse geometrical shapes.

The non-volatile memory device in accordance with the first embodiment of the present invention may include the inter-layer dielectric layer 106, the selection plug 113, the first contact plug 111, and the second contact plug 112. The inter-layer dielectric layer 106 is formed over the substrate 101. The selection plug 113 is formed over the selection gate SG. The first contact plug 111 is formed over the first junction region 107, and the second contact plug 112 is formed over the second junction region 108. The inter-layer dielectric layer 106 may be one single layer selected from the group consisting of an oxide layer, a nitride layer, and an oxynitride layer, or a stacked layer where at least two layers selected from the group consisting of an oxide layer, a nitride layer, and an oxynitride layer are stacked. The selection plug 113, the first contact plug 111, and the second contact plug 112 may be formed along with the control plug 110, and they may have a form that penetrates through the inter-layer dielectric layer 106.

The first gap 115 between the floating gate FG and the selection gate SG may be the same as or wider than the second gap 116 between the control plug 110 and the floating gate FG. The line width of the second gap 116 may be the same as or narrower than the gap between the floating gate FG and the first contact plug 111. For example, the control plug 110 may contact the charge blocking layer 105 on the sidewall of the floating gate FG, and the first contact plug 111 may contact the charge blocking layer 105 on the sidewall of the floating gate FG or may be spaced apart by a predetermined gap from the charge blocking layer 105 on the sidewall of the floating gate FG. Additionally, the area of the sidewalls of the floating gate FG and the first contact plug 111 facing each other may be smaller than the area of the sidewalls of the control plug 110 and the floating gate FG facing each other. As described above, the gaps and the areas of the facing sidewalls between the floating gate FG, the first contact plug 111, and the control plug 110 are made different to prevent interference occurring in the floating gate FG due to the bias voltage applied through the first contact plug 111.

The non-volatile memory device in accordance with the first embodiment of the present invention may include the charge blocking layer 105 for gap-filling the first gap 115 and the second gap 116, and a barrier layer (not shown) formed on the sidewall of the control plug 110. The charge blocking layer 105 and the barrier layer (not shown) may function as a dielectric layer, e.g., an Inter Poly Dielectric (IPD), for insulating the floating gate FG and the control plug 110 from each other, and the floating gate FG and the selection gate SG from each other. Therefore, the charge blocking layer 105 and the barrier layer (not shown) may include an insulation layer. Each of the charge blocking layer 105 and the barrier layer (not shown) may be one layer selected from the group consisting of an oxide layer, a nitride layer, and an oxynitride layer, or a stacked layer where at least two layers selected from the group consisting of an oxide layer, a nitride layer, and an oxynitride layer are stacked. For example, the charge blocking layer 105 and the barrier layer (not shown) may be an oxide-nitride-oxide (ONO) layer.

The charge blocking layer 105 may be a spacer formed on the sidewalls of the floating gate FG and the selection gate SG. For example, the charge blocking layer 105 may be formed through a spacer forming process, which is a predetermined logic process, to protect the sidewalls of the floating gate FG and the selection gate SG. The barrier layer (not shown) not only complements the function of the charge blocking layer 105 but also substitutes the charge blocking layer 105 when the charge blocking layer 105 loses its function due to procedural variables. The barrier layer (not shown) may be a spacer formed on the sidewalls of the control plug 110. The barrier layer (not shown) may be formed selectively.

The non-volatile memory device having the above-described structure may have improved operation characteristics and integration degree while preventing over-erase by including the selection gate SG that couples the floating gate FG. Additionally, the operation characteristics and integration degree may be improved more effectively by including the control plug 110 that couples the floating gate FG along with the selection gate SG.

Since the coupling ratio between the first gap 115 and the second gap 116 is raised as the line widths of the first gap 115 and the second gap 116 are decreased, the operation characteristics and integration degree of the non-volatile memory device may be improved by reducing design rule. That is, the operation characteristics and integration degree of the non-volatile memory device may be improved, as the design rule of the logic process, which is a basic process for fabricating the non-volatile memory device, is decreased.

Furthermore, the non-volatile memory device having the above-described structure may be fabricated without an additional process that is performed in addition to the logic process.

A method for operating the non-volatile memory device in accordance with the first embodiment of the present invention is described with reference to FIGS. 1A to 1D and the following Table 1. Table 1 is an example of an operation condition of the non-volatile memory device shown in FIGS. 1A to 1D.

TABLE 1

| Operation | Program | Erase | Read | |
|---|---|---|---|---|
| Scheme | HCI | BTBT | Forward | Reverse |
| Conductive Line (Control plug + Selection gate) | VPP_2 | −VPP_2 | VCC | VCC |
| First Junction Region | VPP_1 | VPP_1 | Vread (~1 V) | GND |
| Second Junction Region | GND | GND | GND | Vread (~1 V) |
| Well (or Substrate) | GND | GND | GND | GND |

A program operation may be performed using a Hot Carrier Injection (HCI) scheme. Specifically, a method of applying a first pumping voltage VPP_1 and a ground voltage GND to the first junction region 107 and the second junction region 108, respectively, while coupling the floating gate FG by applying a second pumping voltage VPP_2 to the conductive line 114, may be used. The first pumping voltage VPP_1 and the second pumping voltage VPP_2 are voltages obtained by boosting a power source voltage VCC. The level of the second pumping voltage VPP_2 applied to the conductive line 114 may be the same as or higher than the level of the first pumping voltage VPP_1 applied to the first junction region 107. A unit cell may be programmed as a thermion, generated from a field formed between the first junction region 107 and the second junction region 108, is implanted into the floating gate FG while the floating gate FG is coupled. The thermion implanted into the floating gate FG raises the threshold voltage of the unit cell.

Subsequently, an erase operation may be performed using a Band-To-Band Tunneling (BTBT) scheme. Particularly, the first pumping voltage VPP_1 and the ground voltage GND are applied to the first junction region 107 and the second junction region 108, respectively, while the floating gate FG is coupled with a negative voltage by applying a second negative pumping voltage VPP_2 to the conductive line 114. A unit cell may be erased as the Band-To-Band Tunneling (BTBT) occurs between the floating gate FG and the first junction region 107 due to the difference of voltage level between the floating gate FG coupled with the negative voltage and the first junction region 107 to which the first pumping voltage VPP_1 is applied. A thermal hole generated from the BTBT is implanted into the floating gate FG so as to decrease the threshold voltage of the unit cell.

A read operation is now described. A read operation may be divided into a forward read operation and a reverse read operation. The forward read operation is a read operation that is performed as charges move in the same direction as the charge moving direction during a program operation. The reverse read operation is a read operation that is performed as charges move in the opposite direction to the charge moving direction during a program operation. The forward read operation may be more easily performed in a cell array of a simple structure, compared to the reverse read operation. Therefore, the forward read operation is advantageous in terms of integration degree and procedural difficulty. However, the reverse read operation is more tolerant to read disturbance than the forward read operation.

According to the forward read operation, the floating gate FG is coupled by applying the power source voltage VCC to the conductive line 114, and a read voltage Vread and the ground voltage GND are applied to the first junction region 107 and the second junction region 108, respectively. During the reverse read operation, the floating gate FG is coupled by applying the power source voltage VCC to the conductive line 114, and the ground voltage GND and the read voltage Vread are applied to the first junction region 107 and the second junction region 108, respectively. The floating gate FG is coupled according to the power source voltage VCC applied to the conductive line 114. It is determined whether or not a channel is formed under the floating gate FG according to whether there is an electron in the inside of the floating gate FG. A unit cell may be read by sensing the presence of the channel.

Described hereafter are a cell array of a non-volatile memory device that may be formed based on the above-described unit cell of the non-volatile memory device in accordance with the first embodiment of the present invention and the operation method thereof. The following embodiments of the cell array use the reference numerals appearing in FIGS. 1A to 1D, therefore a detailed description of the structures having the same reference numerals is omitted.

Figure 3:
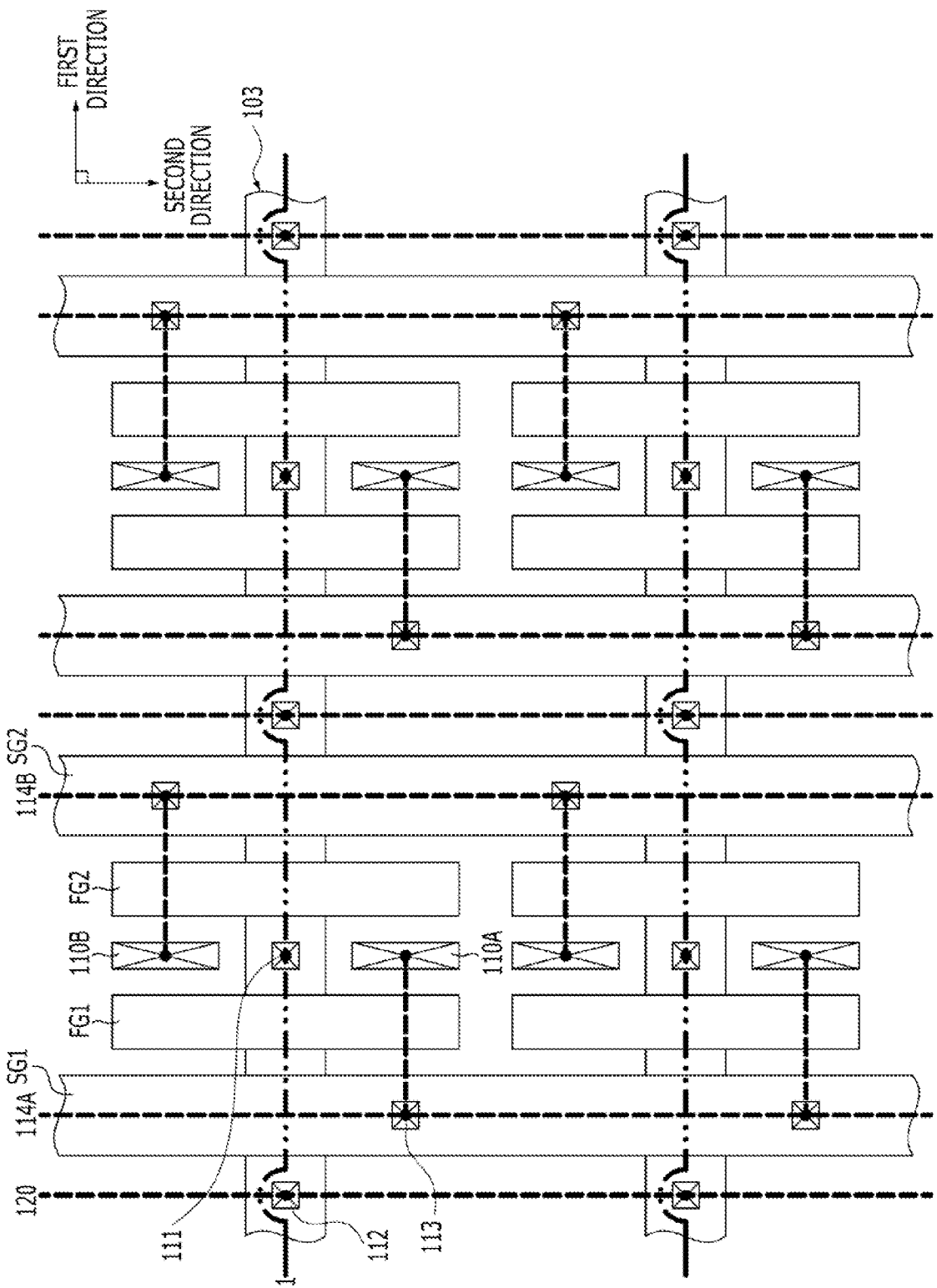

FIGS. 3 and 4 are plan views illustrating a cell array including the unit cell of the non-volatile memory device in accordance with the first embodiment of the present invention.

Referring to FIGS. 3 and 4, the cell array includes an isolation layer 102 (shown in FIGS. 1C and 1D), a plurality of contact plugs 111 and 112, a first floating gate FG1 and a second floating gate FG2, a first selection gate SG1 and a second selection gate SG2, a first control plug 110A and a second control plug 110B, and a charge blocking layer 105. The isolation layer 102 is formed over a substrate 101 (shown in FIGS. 1C and 1D) and defines a plurality of active regions 103. The contact plugs 111 and 112 are formed over the active regions 103. For example, the first floating gate FG1 and the second floating gate FG2 are formed over the substrate 101 on both sides of one contact plug 111 selected among the contact plugs 111 and 112. The first selection gate SG1 and the second selection gate SG2 are formed over the substrate 101 on both sides of the selected contact plug 111. Additionally, the first selection gate SG1 and the second selection gate SG2 are formed to be adjacent to the first floating gate FG1 with a first gap 115 (shown in FIGS. 1C and 1D) from the first floating gate FG1 and to the second floating gate FG2 with a first gap 115 from the second floating gate, respectively. The first control plug 110A and the second control plug 110B are formed over the isolation layer 102 between the first floating gate FG1 and the second floating gate FG2. The first control plug 110A and the second control plug 110B are formed to be adjacent to the first floating gate FG1 with a second gap 116 (shown in FIG. 1D), from the first floating gate FG1 and to the second floating gate FG2 with a second gap 116 from the second floating gate FG2, respectively. Further, the first control plug 110A and the second control plug 110B are formed to be symmetrical to each other with respect to the selected contact plug 111. The charge blocking layer 105 gap-fills the first gap 115 and the second gap 116. Herein, the first selection gate SG1 and the first control plug 110A may have at least one sidewall facing the sidewall of the first floating gate FG1, and the second selection gate SG2 and the second control plug 110B may have at least one sidewall facing the sidewall of the second floating gate FG2. The first control plug 110A may include at least one plug having a sidewall facing the sidewall of the first floating gate FG1, and the second control plug 110B may include at least one plug having a sidewall facing the sidewall of the second floating gate FG2.

The first control plug 110A and the first selection gate SG1 receive the same bias voltage, and the first floating gate FG1 may be coupled in response to the bias voltage applied to the first selection gate SG1 and the first control plug 110A. The second control plug 110B and the second selection gate SG2 receive the same bias voltage, and the second floating gate FG2 may be coupled in response to the bias voltage applied to the second selection gate SG2 and the second control plug 110B. Therefore, a first conductive line 114A for coupling the first selection gate SG1 and the first control plug 110A through a selection plug 113 formed over the first selection gate SG1, and a second conductive line 114B for coupling the second selection gate SG2 and the second control plug 110B through a selection plug 113 formed over the second selection gate SG2, may be included. The first conductive line 114A and the second conductive line 114B, which is the conductive line 114, may be lines extended in the second direction.

The active regions 103 may be of a line type extended in the first direction, and the active regions 103 may be disposed in the second direction with a predetermined gap therebetween. The first floating gate FG1 and the second floating gate FG2, which are the floating gate FG, may be of a bar type extended in the second direction, and they may be disposed to overlap the active regions 103. The first selection gate SG1 and the second selection gate SG2, which are the selection gate SG, may be of a line type extended in the second direction crossing the active regions 103. The selection gates SG, e.g., the first selection gate SG1 and the second selection gate SG2, may be disposed in the first direction with a predetermined gap therebetween.

The contact plugs 111 and 112 may be disposed in the direction that the active regions 103 are extended, with a predetermined gap therebetween. Herein, the first contact plugs 111 may be disposed at every $(2N+1)^{th}$ position and the second contact plugs 112 may be disposed at every $2N^{th}$ position, where N is a natural number except '0'. The first contact plug 111 may be coupled with a bit line 121. The bit line 121 may be formed in a different layer from the layer where the conductive line 114 is formed and the bit line 121 may be of a line type extended in the first direction. The second contact plug 112 may be coupled with a source line 120. The source line 120 may be formed in the same layer where the conductive line 114 is formed, and the source line 120 may be of a line type extended in the second direction.

Whereas the non-volatile memory device in accordance with the first embodiment of the present invention has the control plug 110 and the selection gate SG electrically coupled through the conductive line 114, the non-volatile memory device in accordance with a second embodiment of the present invention, which is described below, has the control plug 110 and the selection gate SG electrically isolated from each other. This will be described below with reference to the drawings. Since the same reference numeral is given to the same structure appearing in the first embodiment, a detailed description of it is omitted.

Figure 5A:
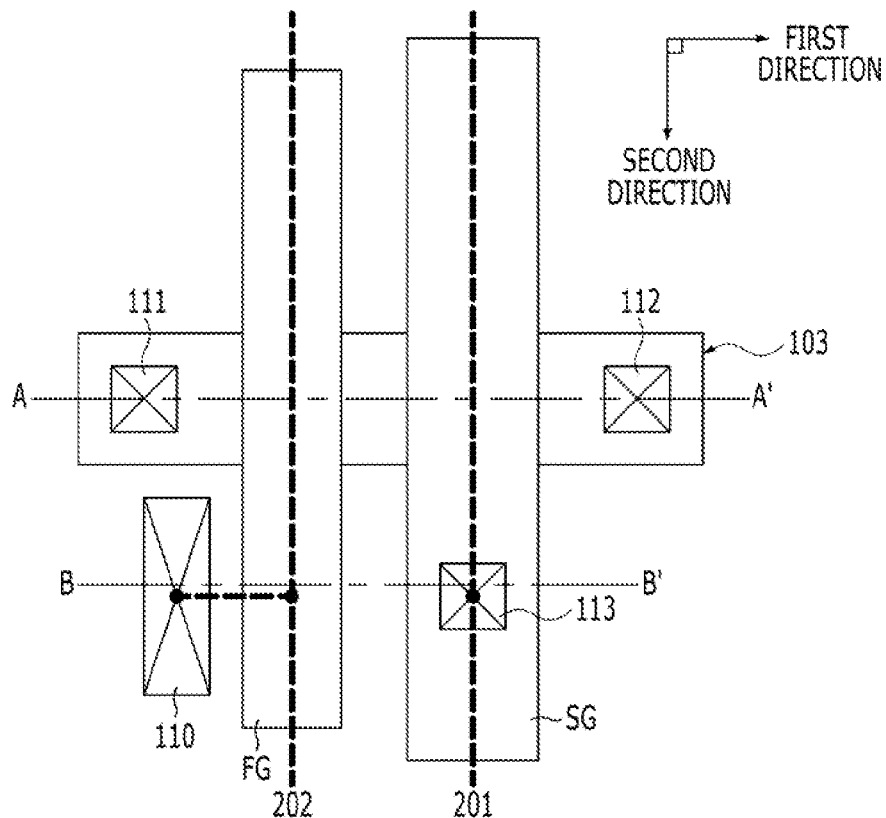
FIGS. 5A to 5D illustrate a unit cell of a non-volatile memory device in accordance with a second embodiment of the present invention.
Figure 5B:
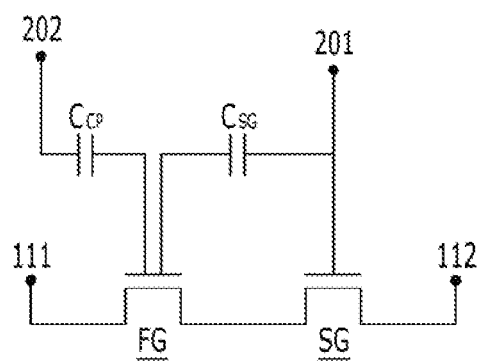
Figure 5C:
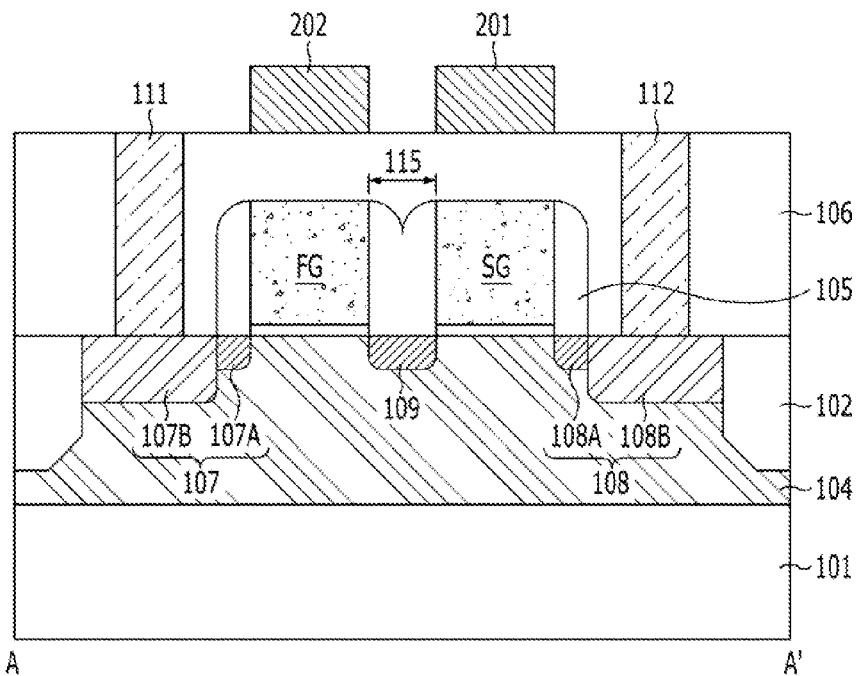
Figure 5D:
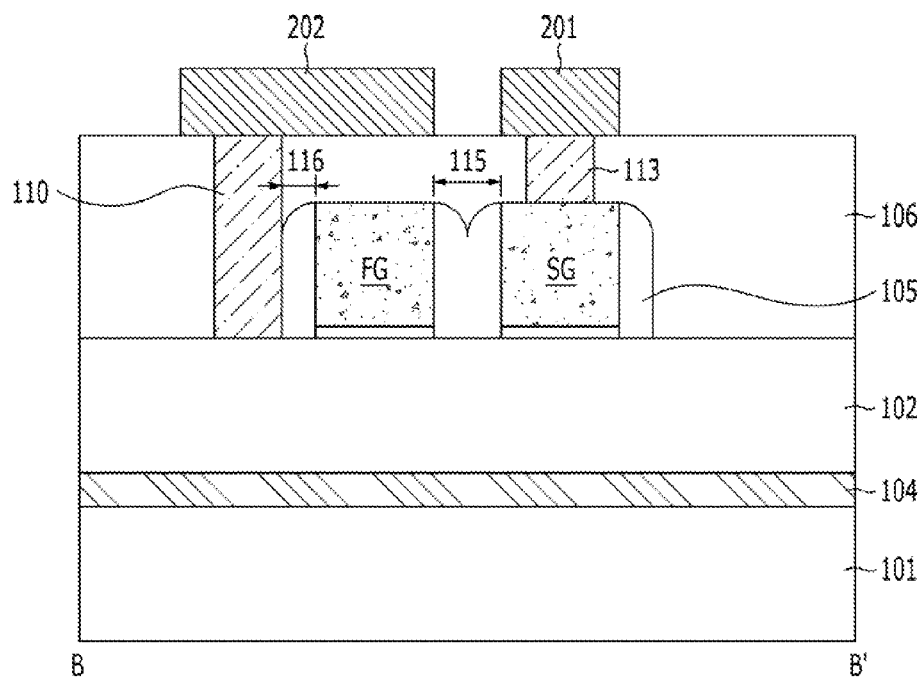
Figure 6A:
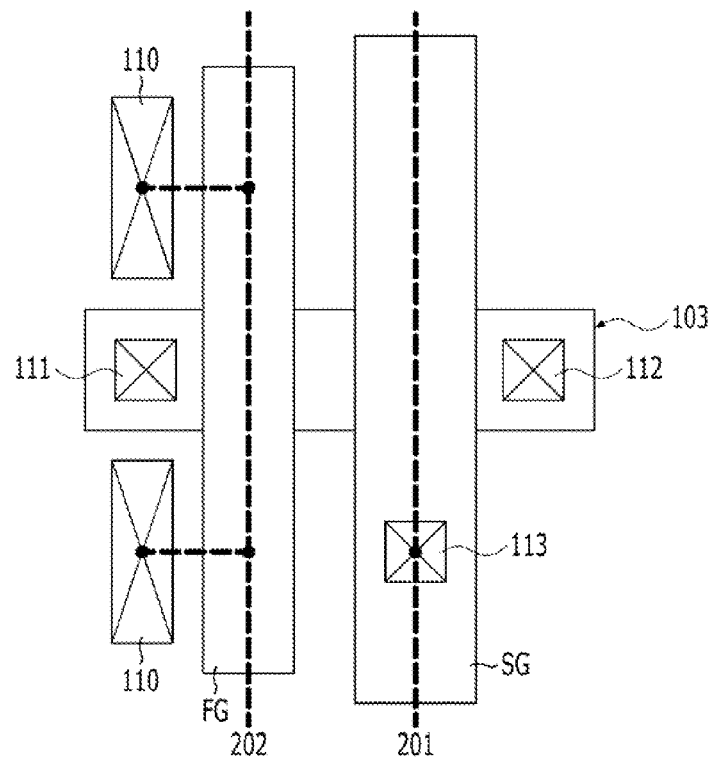
Figure 6B:
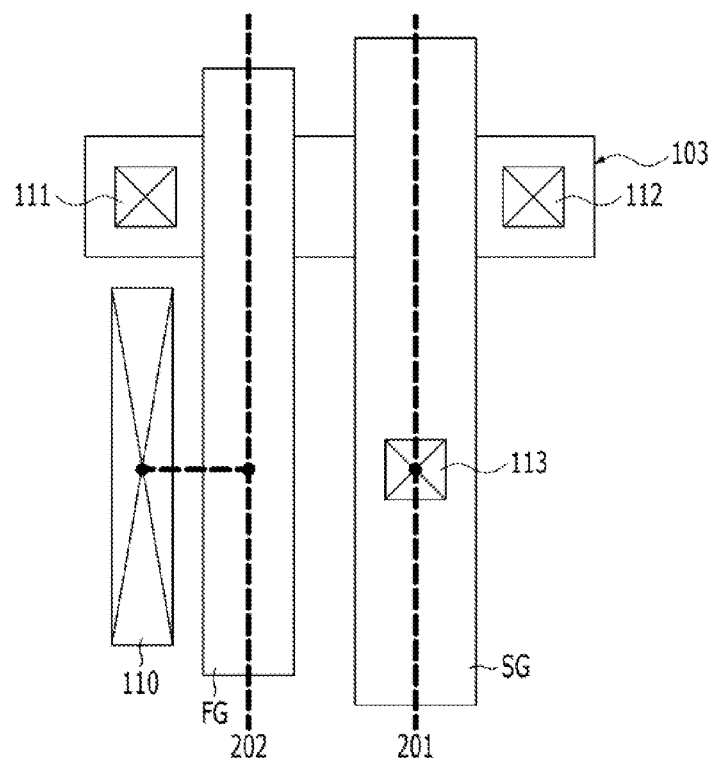

FIGS. 5A to 5D illustrate a unit cell of a non-volatile memory device in accordance with a second embodiment of the present invention, and FIGS. 6A to 6C illustrate a unit cell of a non-volatile memory device in accordance with a modified example of the second embodiment of the present invention. Specifically, FIG. 5A is a plan view, and FIG. 5B is an equivalent circuit diagram. FIGS. 5C and 5D are cross-sectional views obtained by cutting the unit cell of FIG. 5A along a line A-A' and a line B-W, respectively.

Referring to FIGS. 5A to 5D, the non-volatile memory device in accordance with the second embodiment of the present invention may include an isolation layer 102, a floating gate FG, a selection gate SG, a control plug 110, and a charge blocking layer 105. The isolation layer 102 is formed over a substrate 101 and defines an active region 103. The floating gate FG is formed over the substrate 101. The selection gate SG is formed over the substrate 101 on one side of the floating gate FG with a first gap 115 from the floating gate FG. The control plug 110 is formed over the isolation layer 102 on the other side of the floating gate FG with a second gap 116 from the floating gate FG. The charge blocking layer 105 gap-fills the first gap 115 and the second gap 116.

Furthermore, the non-volatile memory device in accordance with the second embodiment of the present invention may include a first junction region 107, a second junction region 108, a third junction region 109, the first contact plug 111, and the second contact plug 112. The first junction region 107 is formed in the active region 103 to be adjacent to the floating gate FG. The second junction region 108 is formed in the active region 103 to be adjacent to the selection gate SG. The third junction region 109 is formed between the floating gate FG and the selection gate SG, that is, in the active region 103 under the first gap 115. The first contact plug 111 is formed over the first junction region 107, and the second contact plug 112 is formed over the second junction region 108.

Additionally, the non-volatile memory device in accordance with the second embodiment of the present invention may include an inter-layer dielectric layer 106, a selection plug 113, a selection line 201 and a control line 202. The inter-layer dielectric layer 106 is formed over the substrate 101. The selection plug 113 penetrates through the inter-layer dielectric layer 106 to couple with the selection gate SG. The control plug 110 penetrates through the inter-layer dielectric layer 106. The selection line 201 is formed over the inter-layer dielectric layer 106 and coupled with the selection plug 113. The control line 202 is formed over the inter-layer dielectric layer 106 and coupled with the control plug 110. The control plug 110 may receive a bias voltage through the control line 202 and the selection gate SG may receive a bias voltage through the selection line 201. The floating gate FG may be coupled in response to the bias voltages applied to the selection gate SG and the control plug 110.

The non-volatile memory device having the above-described structure may have improved operation characteristics and integration degree while preventing over-erase by including the selection gate SG that couples the floating gate FG. The operation characteristics and integration degree may be improved more effectively by including the control plug 110 that couples the floating gate FG along with the selection gate SG.

An independent bias voltage is applied to each of the control plug 110 and the selection gate SG, therefore the degree of freedom with respect to the operation method may be improved more than that of the first embodiment.

Moreover, since the coupling ratio between the first gap 115 and the second gap 116 is raised as the line widths of the first gap 115 and the second gap 116 are decreased, the operation characteristics and integration degree of the non-volatile memory device may be improved by reducing design rule. That is, the operation characteristics and integration degree of the non-volatile memory device may be improved, as the design rule of the logic process, which is a basic process for fabricating the non-volatile memory device, is decreased.

Furthermore, the non-volatile memory device having the above-described structure may be fabricated without an additional process that is performed in addition to the logic process.

A method for operating the non-volatile memory device in accordance with the second embodiment of the present invention is now described with reference to FIGS. 5A to 5D and the following Table 2. Table 2 is an example of an operation condition of the non-volatile memory device shown in FIGS. 5A to 5D.

TABLE 2

| Operation | Program | Erase | Read | |
|---|---|---|---|---|
| | | | Forward | Reverse |
| Scheme | HCI | BTBT | | |
| Control Line (Control Plug) | VPP_3 | −VPP_3 | GND~VCC | GND~VCC |
| Selection Line (Selection Gate) | VPP_2 | −VPP_2 | VCC | VCC |
| First Junction Region | VPP_1 | VPP_1 | Vread (~1 V) | GND |
| Second Junction Region | GND | GND | GND | Vread (~1 V) |
| Well (or Substrate) | GND | GND | GND | GND |

A program operation may be performed using a Hot Carrier Injection (HCI) scheme. That is, a method of applying a first pumping voltage VPP_1 and a ground voltage GND to the first junction region 107 and the second junction region 108, respectively, while coupling the floating gate FG by applying a second pumping voltage VPP_2 to the selection gate SG through the selection line 201 and applying a third pumping voltage VPP_3 to the control plug 110 through the control line 202, may be used. A unit cell may be programmed as a thermion generated from a field formed between the first junction region 107 and the second junction region 108, and is implanted into the floating gate FG while the floating gate FG is coupled. The thermion implanted into the floating gate FG raises the threshold voltage of the unit cell.

Subsequently, an erase operation may be performed using a Band-To-Band Tunneling (BTBT) scheme. Specifically, the first pumping voltage VPP_1 and the ground voltage GND are applied to the first junction region 107 and the second junction region 108, respectively, while the floating gate FG is coupled with negative voltages by applying a second negative pumping voltage −VPP_2 to the selection gate SG through the selection line 201 and applying a third negative pumping voltage −VPP_3 to the control plug 110 through the control line 202. A unit cell may be erased as the Band-To-Band Tunneling (BTBT) occurs between the floating gate FG and the first junction region 107, due to the difference of voltage level between the floating gate FG coupled with the negative voltages and the first junction region 107 to which the first pumping voltage VPP_1 is applied, and a thermal hole generated from the BTBT is implanted into the floating gate FG to decrease the threshold voltage of the unit cell.

A read operation is now described. A read operation may be divided into a forward read operation and a reverse read operation. The forward read operation may be performed by applying a voltage ranging from the ground voltage GND to the power source voltage VCC to the control plug 110 and applying the power source voltage VCC to the selection gate SG to couple the floating gate FG, and by applying the read voltage Vread and the ground voltage GND to the first junction region 107 and the second junction region 108, respectively. However, the reverse read operation may be performed by applying a voltage ranging from the ground voltage GND to the power source voltage VCC to the control plug 110 and applying the power source voltage VCC to the selection gate SG to couple the floating gate FG, and by applying the ground voltage GND and the read voltage Vread to the first junction region 107 and the second junction region 108, respectively. The floating gate FG is coupled based on the voltage applied to the control plug 110 and/or the selection gate SG, and whether or not a channel is formed under the floating gate FG is decided based on whether there is an electron in the inside of the floating gate FG. A unit cell may be read by sensing the presence of the channel.

Described hereafter are a cell array of a non-volatile memory device that may be formed based on the above-described unit cell of the non-volatile memory device in accordance with the second embodiment of the present invention and the operation method thereof.

Figure 7:
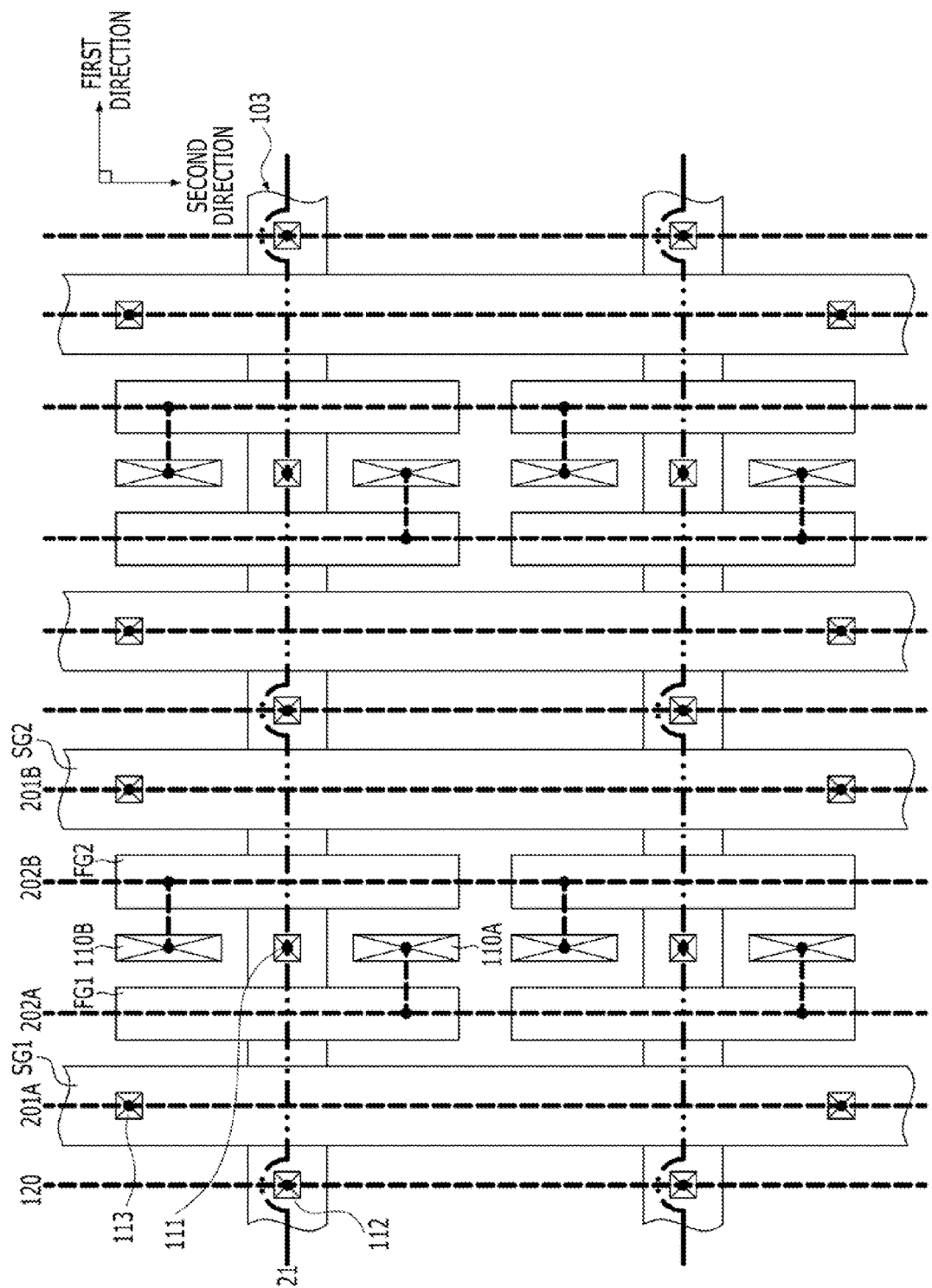
FIGS. 7 and 8 are plan views illustrating a cell array including the unit cell of the non-volatile memory device in accordance with the second embodiment of the present invention.
Figure 8:
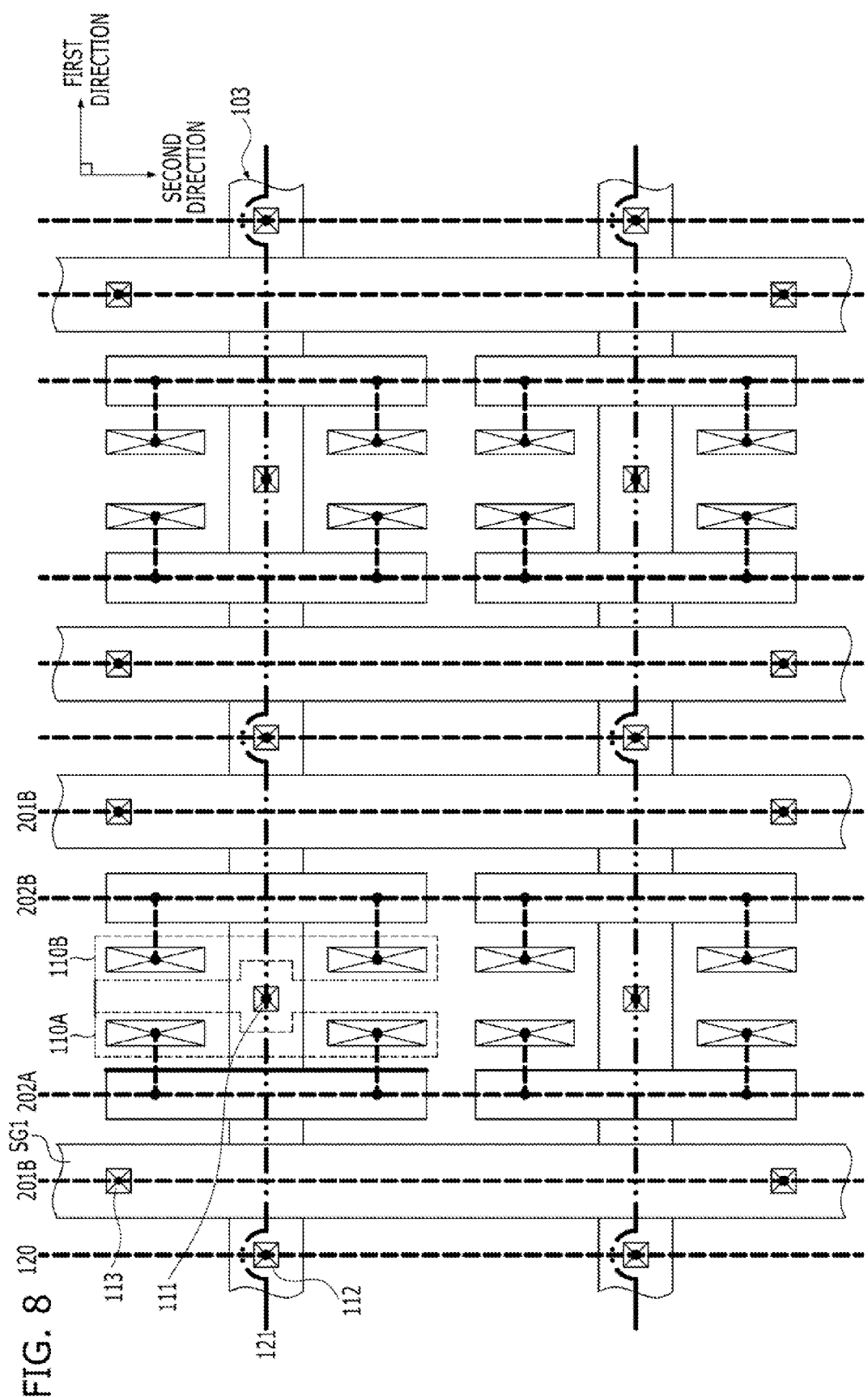

FIGS. 7 and 8 are plan views illustrating a cell array including the unit cell of the non-volatile memory device in accordance with the second embodiment of the present invention.

Referring to FIGS. 7 and 8, the cell array includes an isolation layer 102 (shown in FIGS. 5C and 5d), a plurality of contact plugs 111 and 112, a first floating gate FG1 and a second floating gate FG2, a first selection gate SG1 and a second selection gate SG2, a first control plug 110A and a second control plug 110B, and a charge blocking layer 105 (shown in FIGS. 5C and 5d). The isolation layer 102 is formed over a substrate 101 (shown in FIGS. 5C and 5d) and defines a plurality of active regions 103. The contact plugs 111 and 112 are formed over the active regions 103. For example, the first floating gate FG1 and the second floating gate FG2 are formed over the substrate 101 on both sides of one contact plug 111 selected among the contact plugs 111 and 112. The first selection gate SG1 and the second selection gate SG2 are formed over the substrate 101 on both sides of the selected contact plug 111. The first selection gate SG1 and the second selection gate SG2 are formed to be adjacent to the first floating gate FG1 with a first gap 115 from the first floating gate FG1 and to the second floating gate FG2 with a first gap 115 from the second floating gate FG2, respectively. The first control plug 110A and the second control plug 110B are formed over the isolation layer 102 between the first floating gate FG1 and the second floating gate FG2. The first control plug 110A and the second control plug 108 are formed to be adjacent to the first floating gate FG1 with a second gap 116 from the first floating gate FG1 and to the second floating gate FG2 with a second gap 116 from the second floating gate FG2, respectively. Furthermore, the first control plug 110A and the second control plug 110B are formed to be symmetrical to each other with respect to the selected contact plug 111. The charge blocking layer 105 gap-fills the first gap 115 and the second gap 116. The first selection gate SG1 and the first control plug 110A may have at least one sidewall facing the sidewall of the first floating gate FG1, and the second selection gate SG2 and the second control plug 110B may have at least one sidewall facing the sidewall of the second floating gate FG2. The first control plug 110A may include at least one plug having a sidewall facing the sidewall of the first floating gate FG1, and the second control plug 110B may include at least one plug having a sidewall facing the sidewall of the second floating gate FG2.

The first control plug 110A and the first selection gate SG1 receive different bias voltages, and the first floating gate FG1 may be coupled in response to the bias voltages applied to the first selection gate SG1 and the first control plug 110A. The second control plug 110B and the second selection gate SG2 receive different bias voltages, and the second floating gate FG2 may be coupled in response to the bias voltages applied to the second selection gate SG2 and the second control plug 110B.

Therefore, the first selection gate SG1 and the second selection gate SG2 may be coupled with a first selection line 201A and a second selection line 201B through the selection plug 113 formed over the selection gate SG, respectively. The first selection line 201A and the second selection line 201B may be of a line type extended in the second direction. The first control plug 110A and the second control plug 110B may be coupled with a first control line 202A and a second control line 202B, respectively. The first control line 202A and the second control line 202B may be of a line type extended in the second direction.

The active regions 103 may be of a line type extended in the first direction, and the active regions 103 may be disposed in the second direction with a predetermined gap therebetween. The first floating gate FG1 and the second floating gate FG2, which is the floating gate FG, may be of a bar type extended in the second direction, and they may be disposed to overlap the active regions 103. The first selection gate SG1 and the second selection gate SG2, which is the selection gate SG, may be of a line type extended in the second direction crossing the active regions 103. The selection gates SG, e.g., the first selection gate SG1 and the second selection gate SG2, may be disposed in the first direction with a predetermined gap therebetween.

The contact plugs 111 and 112 may be disposed in the direction that the active regions 103 are extended, with a predetermined gap therebetween. The first contact plugs 111 may be disposed at every $(2N+1)^{th}$ position and the second contact plugs 112 may be disposed at every $2N^{th}$ position, where N is a natural number except "0". The second contact plug 112 may be coupled with a source line 120. The source line 120 may be formed in the same layer where the selection line 201 and the control line 202 are formed, and the source line 120 may be of a line type extended in the second direction. The first contact plug 111 may be coupled with a bit line 121, and the bit line 121 may be formed in a different layer from the layer where the source line 120, the selection line 201 and the control line 202 are formed. The bit line 121 may be of a line type extended in the first direction.

Whereas the non-volatile memory device in accordance with the second embodiment of the present invention has the control plug 110 and the selection gate SG electrically isolated from each other, the non-volatile memory device in accordance with a third embodiment of the present invention, which is described below, has the selection gate SG, the first contact plug 111 and the control plug 110, wherein the selection gate SG is electrically isolated from the first contact plug 111 and the control plug 110 and the first contact plug 111 is electrically coupled to the control plug 110. This will be described below with reference to FIGS. 9A to 9D. Since the same reference numeral is given to the same structure appearing in the first embodiment, a detailed description of it is omitted.

Figure 9A:
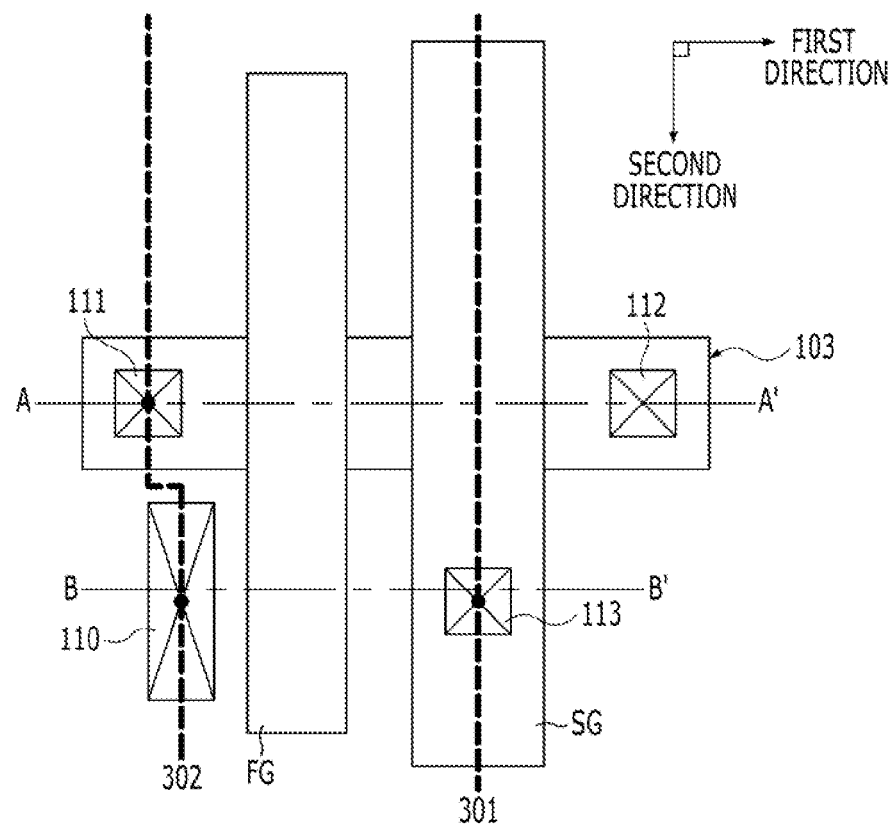
FIGS. 9A to 9D illustrate a unit cell of a non-volatile memory device in accordance with a third embodiment of the present invention.
Figure 9B:
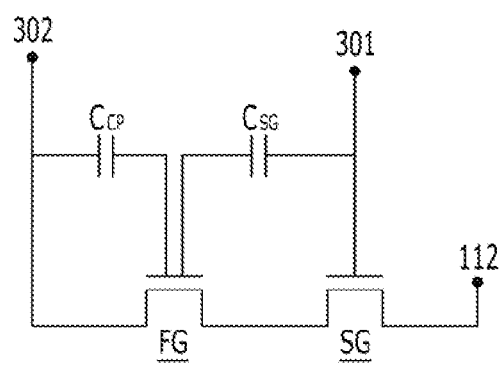
Figure 9C:
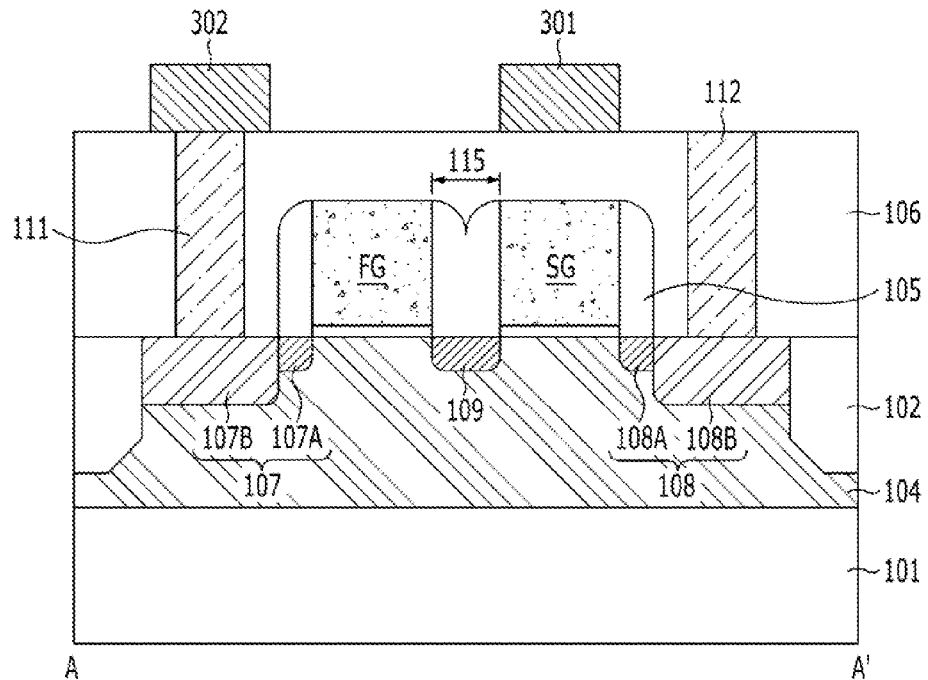
Figure 9D:
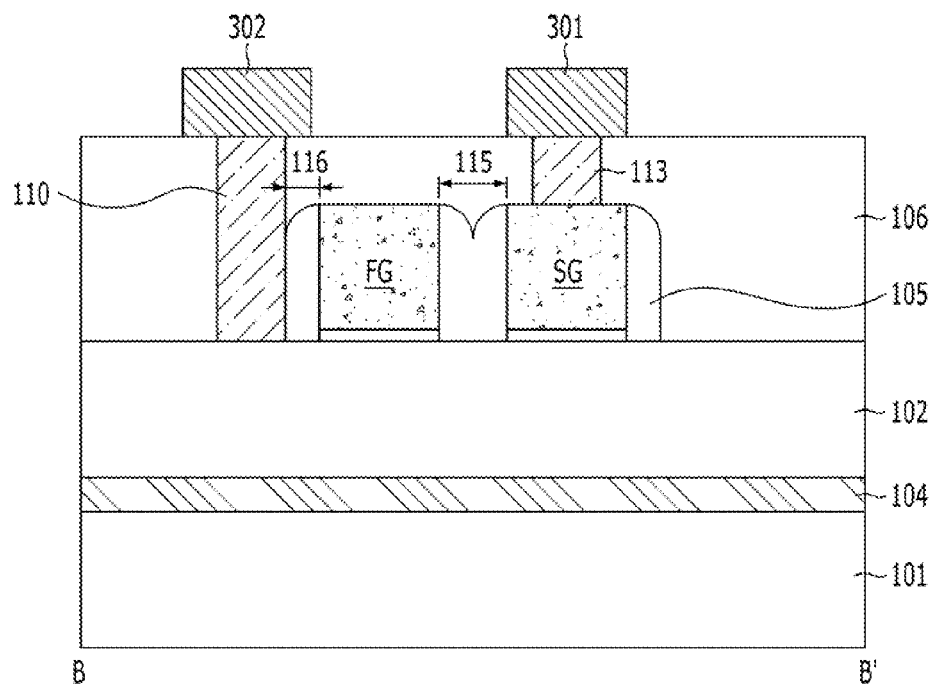

FIGS. 9A to 9D illustrate a unit cell of a non-volatile memory device in accordance with a third embodiment of the present invention. Specifically, FIG. 9A is a plan view, and FIG. 9B is an equivalent circuit diagram. FIGS. 9C and 9D are cross-sectional views of the unit cell of FIG. 9A along a line A-A' and a line B-B', respectively.

Referring to FIGS. 9A to 9D, the non-volatile memory device in accordance with the third embodiment of the present invention may include an isolation layer 102, a floating gate FG, a selection gate SG, a control plug 110, and a charge blocking layer 105. The isolation layer 102 is formed over a substrate 101 and defines an active region 103. The floating gate FG is formed over the substrate 101. The selection gate SG is formed over the substrate 101 on one side of the floating gate FG with a first gap 115 from the floating gate FG. The control plug 110 is formed over the isolation layer 102 on the other side of the floating gate FG with a second gap 116 from the floating gate FG. The charge blocking layer 105 gap-fills the first gap 115 and the second gap 116.

The non-volatile memory device in accordance with the third embodiment of the present invention may include a first junction region 107, a second junction region 108, a third junction region 109 the first contact plug 111, and the second contact plug 112. The first junction region 107 is formed in the active region 103 to be adjacent to the floating gate FG. The second junction region 108 is formed in the active region 103 to be adjacent to the selection gate SG. The third junction region 109 is formed between the floating gate FG and the selection gate SG, that is, in the active region 103 under the first gap 115. The first contact plug 111 is formed over the first junction region 107, and the second contact plug 112 is formed over the second junction region 108.

Additionally, the non-volatile memory device in accordance with the third embodiment of the present invention may include an inter-layer dielectric layer 106, a selection plug 113, a selection line 301 and a control line 302. The inter-layer dielectric layer 106 is formed over the substrate 101. The selection plug 113 penetrates through the inter-layer dielectric layer 106 to couple with the selection gate SG. The control plug 110 penetrates through the inter-layer dielectric layer 106. The selection line 301 is formed over the inter-layer dielectric layer 106 and coupled with the selection plug 113. The control line 302 is formed over the inter-layer dielectric layer 106 and coupled with the control plug 110 and the first contact plug 111. The control plug 110 and the first contact plug 111 may receive the same bias voltage through the control line 302. The selection gate SG may receive a bias voltage through the selection line 301. The floating gate FG may be coupled in response to the bias voltages applied to the control plug 110 and the first contact plug 111 and the selection gate SG.

Although the third embodiment of the present invention illustrates when the control plug 110 and the first contact plug 111 are formed independently, the formation of the control plug 110 and the first contact plug 111 may be modified diversely. For example, the first contact plug 111 may not be formed and a portion of the control plug 110 that is formed over the isolation layer 102 may be extended toward the upper portion of the active region 103.

The non-volatile memory device having the above-described structure may have improved operation characteristics and integration degree while preventing over-erase by including the selection gate SG that couples the floating gate FG. The operation characteristics and integration degree may be improved more effectively by including the control plug 110 and the first contact plug 111, which couple the floating gate FG and the selection gate SG.

Furthermore, as a bias voltage is applied to the control plug 110 and the first contact plug 111 and a bias voltage is applied to the selection gate SG, the degree of freedom with respect to the operation method may be improved even more than that of the first embodiment.

Since the coupling ratio between the first gap 115 and the second gap 116 is raised as the line widths of the first gap 115 and the second gap 116 are decreased, the operation characteristics and integration degree of the non-volatile memory device may be improved by reducing design rule. That is, the operation characteristics and integration degree of the non-volatile memory device may be improved, as the design rule of the logic process, which is a basic process for fabricating the non-volatile memory device, is decreased.

Therefore the non-volatile memory device having the above-described structure may be fabricated without an additional process that is performed in addition to the logic process.

A method for operating the non-volatile memory device in accordance with the third embodiment of the present invention is described with reference to FIGS. 9A to 9D and the following Table 3. Table 3 is an example of an operation condition of the non-volatile memory device shown in FIGS. 9A to 9D.

TABLE 3

| Operation | Program | Erase | Read | |
|---|---|---|---|---|
| Scheme | HCI | BTBT | Forward | Reverse |
| Control Line (Control Plug + 1$^{st}$ Contact Plug) | VPP_1 | VPP_1 | Vread (~1 V) | GND |
| Selection Line (Selection Gate) | VPP_2 | −VPP_2 | VCC | VCC |
| First Junction Region | VPP_1 | VPP_1 | Vread (~1 V) | GND |
| Second Junction Region | GND | GND | GND | Vread (~1 V) |
| Well (or Substrate) | GND | GND | GND | GND |

A program operation may be performed using a Hot Carrier Injection (HCI) scheme. That is, a method of applying a first pumping voltage VPP_1 and a ground voltage GND to the first junction region 107 and the second junction region 108, respectively, while coupling the floating gate FG by applying the first pumping voltage VPP_1 to the control plug 110 and the first contact plug 111 through the control line 302 and applying a second pumping voltage VPP_2 to the selection gate SG through the selection line 301, may be used. The first pumping voltage VPP_1 applied to the first junction region 107 may be provided through the control line 302. A unit cell may be programmed as a thermion generated from a field formed between the first junction region 107 and the second junction region 108, and is implanted into the floating gate FG while the floating gate FG is coupled. The thermion implanted into the floating gate FG raises the threshold voltage of the unit cell.

Subsequently, an erase operation may be performed using a Band-To-Band Tunneling (BTBT) scheme. Specifically, the first pumping voltage VPP_1 and the ground voltage GND are applied to the first junction region 107 and the second junction region 108, respectively, while the floating gate FG is coupled with a negative voltage by applying a second negative pumping voltage −VPP_2 to the selection gate SG through the selection line 301. A unit cell may be erased as the Band-To-Band Tunneling (BTBT) occurs between the floating gate FG and the first junction region 107 due to the difference of voltage level between the floating gate FG coupled with the negative voltage and the first junction region 107 to which the first pumping voltage VPP_1 is applied. A thermal hole generated from the BTBT is implanted into the floating gate FG to decrease the threshold voltage of the unit cell.

A read operation is now described. A read operation may be divided into a forward read operation and a reverse read operation. The forward read operation may be performed by applying the power source voltage VCC to the selection gate SG so as to couple the floating gate FG and applying the read voltage Vread and the ground voltage GND to the first junction region 107 and the second junction region 108, respectively. However, the reverse read operation may be performed by applying the power source voltage VCC to the selection gate SG so as to couple the floating gate FG and applying the ground voltage GND and the read voltage Vread to the first junction region 107 and the second junction region 108, respectively. The floating gate FG is coupled based on the voltage applied to the selection gate SG, and whether or not a channel is formed under the floating gate FG is decided based on whether there is an electron in the inside of the floating gate FG. A unit cell may be read by sensing the presence of the channel.

Figure 10:
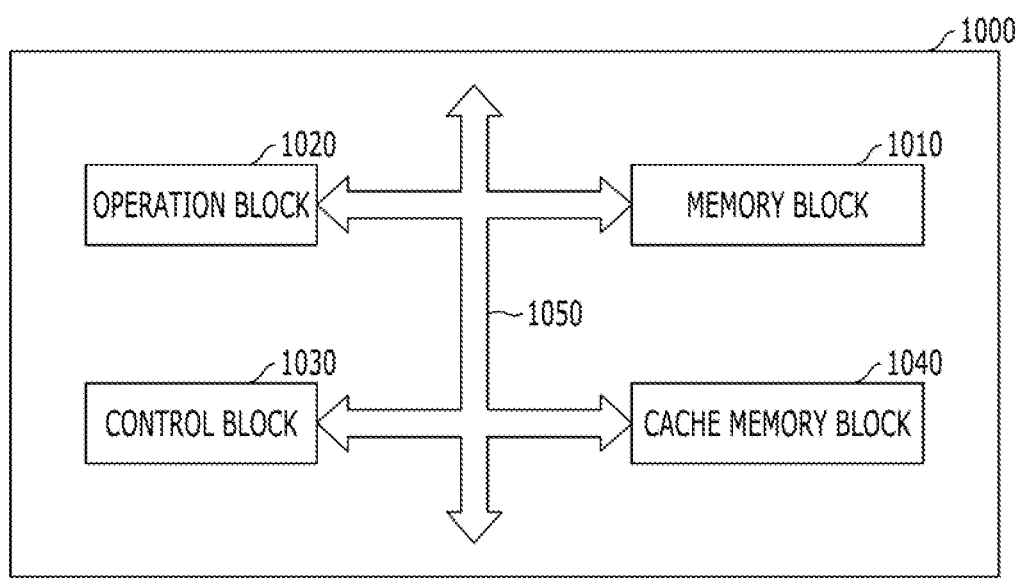
FIG. 10 is a block view illustrating a microprocessor in accordance with an embodiment of the present invention.
Figure 11:
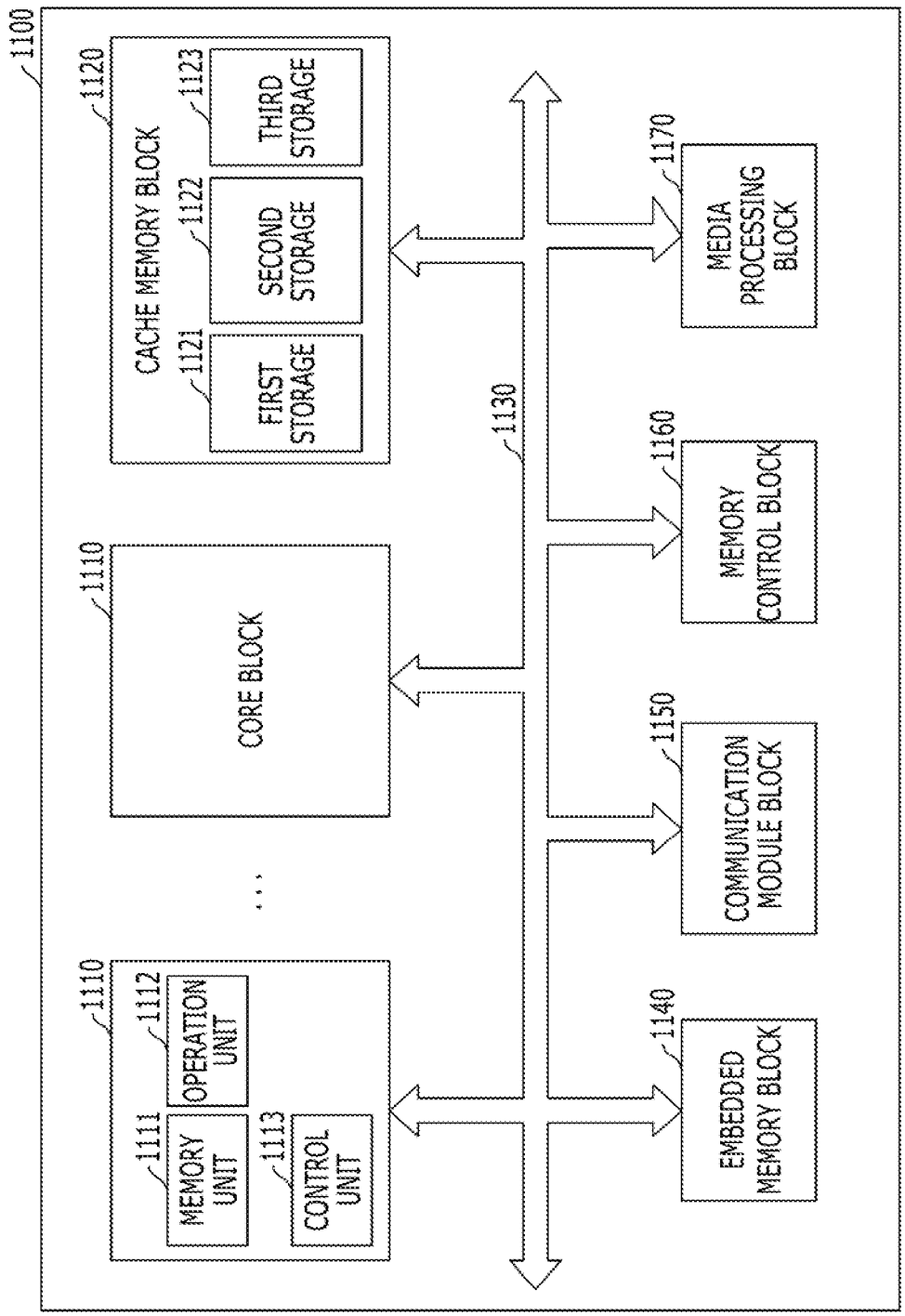
FIG. 11 is a block view illustrating a processor in accordance with an embodiment of the present invention.

An example of the application field of the non-volatile memory device in accordance with the embodiments of the present invention with reference to FIGS. 10 and 11 is now described.

FIG. 10 is a block view illustrating a microprocessor in accordance with an embodiment of the present invention.

Referring to FIG. 10, a microprocessor 1000 controls and manages a series of operations of receiving data from diverse external devices, processing the data, and outputting the processing result to the external devices. The microprocessor 1000 may include a memory block 1010, an operation block 1020, and a control block 1030. Examples of the microprocessor 1000 may include a Central Processing Unit (CPU), a Graphic Processing Unit (GPU), a Digital Signal Processor (DSP), an Application Processor (AP) and the like.

The memory block 1010 is a processor register or a register, which is a portion for storing data in the inside of the microprocessor 1000. The memory block 1010 may include a data register, an address register, and a floating point register. Additionally, the memory block 1010 may include diverse registers. The memory block 1010 may temporarily store the addresses of where the data operated in the operation block 1020, operation result data, and data for an operation are stored.

The memory block 1010 may include the above-described non-volatile memory device. The memory block 1010 including the semiconductor device in accordance with the above-described embodiments of the present invention may include an isolation layer, a floating gate, a selection gate, a control plug, and a charge blocking layer. The isolation layer is formed over a substrate and defines an active region. The floating gate is formed over the substrate. The selection gate is formed over the substrate on one side of the floating gate with a first gap from the floating gate. The control plug is formed over the isolation layer on the other side of the floating gate with a second gap from the floating gate. The charge blocking layer gap-fills the first gap and the second gap. The memory block 1010 described above may be formed through a predetermined logic process without an additional process. The memory block 1010 may have improved operation characteristics and integration degree by including the control plug and the selection gate that easily couple the floating gate while enhancing logic compatibility at the same time. Since diverse known operation methods may be readily applied to the memory block 1010, the memory block 1010 has enormous applicability. Therefore, the memory block 1010 and the microprocessor 1000 including the memory block 1010 may be miniaturized with high performance.

The operation block 1020 is a portion where an operation is performed in the inside of the microprocessor 1000. The operation block 1020 performs four fundamental arithmetic operations or logic operations based on the command decoding result obtained by the control block 1030. The operation block 1020 may include at least one Arithmetic and Logic Unit (ALU).

The control block 1030 receives a signal from the memory block 1010, the operation block 1020, and/or an external device outside the microprocessor 1000, performs a control, such as extracting, decoding, inputting or outputting a command, and performs a process represented by a program.

The microprocessor 1000 in accordance with the embodiment of the present invention may further include a cache memory block for temporarily storing data inputted from the external device or data to be outputted to the external device, other than the memory block 1010. Accordingly, the cache memory block may transfer the data to and receive the data from the memory block 1010, the operation block 1020, and the control block 1030 through a bus interface 1050.

FIG. 11 is a block view of a processor in accordance with an embodiment of the present invention.

Referring to FIG. 11, the processor 1100 includes diverse functional structures other than a microprocessor that controls and manages a series of operations of receiving data from diverse external devices, processing the data, and outputting the processed data to the external devices to improve performance and perform multiple functions. The processor 1100 may include a core block 1110, a cache memory block 1120, and a bus interface 1130. The core block 1110 is a portion where arithmetic and logic operations are performed on an input data transferred from an external device, and the core block 1110 may include a memory unit 1111, an operation unit 1112, and a control unit 1113. The processor 1100 may be a diverse System on Chip (SoC) such as a Multi-Core Processor (MCP), a Graphic Processing Unit (GPU), an Application Processor (AP) and the like.

The memory unit 1111 is a processor register or a register, which is a portion for storing data in the inside of the processor 1100. The memory unit 1111 may include a data register, an address register, and a floating point register. Additionally, the memory unit 1111 may include diverse registers. The memory unit 1111 may temporarily store the addresses of where the data operated in the operation unit 1112, operation result data, and data for an operation are temporarily stored.

The operation unit 1112 is a portion where an operation is performed in the inside of the processor 1100. The operation unit 1112 performs four fundamental arithmetic operations or logic operations based on the command decoding result obtained by the control unit 1113. The operation unit 1112 may include at least one Arithmetic and Logic Unit (ALU).

The control unit 1113 receives a signal from the memory unit 1111, the operation unit 1112, and/or an external device outside the processor 1100, performs a control, such as extracting, decoding, inputting or outputting a command, and performs a process represented by a program.

Differently from the core block 1110 that operates at a high data rate, the cache memory block 1120 temporarily stores data to supplement the difference in the data processing rate of an external device that performs at a low data rate. The cache memory block 1120 may include a first storage 1121, a second storage 1122, and a third storage 1123. Generally, the cache memory block 1120 includes the first storage 1121 and the second storage 1122, and when high-capacity storage is needed, the cache memory block 1120 may further include the third storage 1123. If necessary, the cache memory block 1120 may include more storage. That is, the number of the storages included in the cache memory block 1120 may be different according to design. The first storage 1121, the second storage 1122, and the third storage 1123 may have the same or different data processing rate of storing and detecting data. When the first storage 1121, the second storage 1122, and the third storage 1123 have different data processing rates, the first storage 1121 may have the highest data processing rate. FIG. 11 illustrates when the first storage 1121, the second storage 1122, and the third storage 1123 are all provided in the inside of the cache memory block 1120, but the first storage 1121, the second storage 1122, and the third storage 1123 of the cache memory block 1120 may be formed outside the core block 1110. The difference in the data processing rate between the core block 1110 and the external device may be complemented. Furthermore, the first storage 1121 of the cache memory block 1120 may be disposed in the inside of the core block 1110, and the second storage 1122, and the third storage 1123 may be formed outside the core block 1110 to enhance the function of supplementing the data processing rate.

The bus interface 1130 connects the core block 1110 with the cache memory block 1120 to efficiently transfer data.

The processor 1100 in accordance with the embodiment of the present invention may include a plurality of core blocks 1110, and the core blocks 1110 may share the cache memory block 1120. The core blocks 1110 and the cache memory block 1120 may be coupled through the bus interface 1130. The core blocks 1110 may be formed to have the same structure as the above-described core block. When the processor 1100 includes the core blocks 1110, the first storage 1121 of the cache memory block 1120 may be provided as many times as the number of the core blocks 1110, and the first storages 1121 may be disposed in the respective core blocks 1110. One second storage 1122 and one third storage 1123 may be provided outside the core blocks 1110 and they may be shared by the core blocks 1110 through the bus interface 1130. The data processing rate of the first storages 1121 may be faster than those of the second storage 1122 and the third storage 1123.

The processor 1100 in accordance with the embodiment of the present invention may further include an embedded memory block 1140, a communication module block 1150, a memory control block 1160, and a media processing block 1170. The embedded memory block 1140 stores data. The communication module block 1150 transfers data to and receives data from an external device through a cable or wirelessly. The memory control block 1160 drives an external memory device. The media processing block 1170 processes the data obtained from the processing of the processor 1100 or data inputted from an external input device and outputs the data to an external interface device. Additionally, the processor 1100 may include other modules. The additional modules may transfer data to and receive data from the core block 1110 and the cache memory block 1120, and exchange data between the core block 1110 and the cache memory block 1120 through the bus interface 1130.

The embedded memory block 1140 may include not only a volatile memory but also a non-volatile memory. The volatile memory includes a Dynamic Random Access Memory (DRAM) a Mobile DRAM, and Static Random Access Memory (SRAM). The non-volatile memory includes a Read Only Memory (ROM), a NOR Flash Memory, a NAND Flash Memory, a Phase-Change Random Access Memory (PRAM), a Resistive Random Access Memory (RRAM), a Spin Transfer Torque Random Access Memory (STTRAM), and a Magnetic Random Access Memory (MRAM). Particularly, the non-volatile memory may include the non-volatile memory devices in accordance with the above-described embodiments of the present invention. The embedded memory block 1140 including the non-volatile memory devices in accordance with the above-described embodiments of the present invention, includes an isolation layer, a floating gate, a selection gate, a control plug, and a charge blocking layer. The isolation layer is formed over a substrate and defines an active region. The floating gate is formed over the substrate. The selection gate is formed over the substrate on one side of the floating gate with a first gap from the floating gate. The control plug is formed over the isolation layer on the other side of the floating gate with a second gap from the floating gate. The charge blocking layer gap-fills the first gap and the second gap. The embedded memory block 1140 described above may be formed through a predetermined logic process without an additional process, and the embedded memory block 1140 may have improved operation characteristics and integration degree by including the control plug and the selection gate that easily couple the floating gate while enhancing logic compatibility at the same time. Since diverse known operation methods may be readily applied to the embedded memory block 1140, the embedded memory block 1140 has enormous applicability. Therefore, the embedded memory block 1140 and the processor 1100 including the embedded memory block 1140 may be miniaturized with high performance.

The communication module block 1150 may include both a cable network module that may be connected to a cable network and a wireless network module that may be connected to a wireless network. The cable network module may include a Local Area Network (LAN), a Universal Serial Bus (USB), Ethernet, and Power Line Communication (PLC). The wireless network module may include Infrared Data Association (IrDA), Code Division Multiple Access (CDMA), Time Division Multiple Access (TDMA), Frequency Division Multiple Access (FDMA), wireless LAN, Zigbee, Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet. Access (HSDPA), Wideband CDMA (WCDMA), Ultra WideBand (UWB) and the like.

The memory control block 1160 manages data transferred between the processor 1100 and an external storage device that operates in conformity to a communication protocol different from that of the processor 1100. The memory control block 1160 may include a variety of memory controllers, such as controllers for controlling Integrated Device Electronics (IDE), Serial Advanced Technology Attachment (SATA), Small Computer System Interface (SCSI), Redundant Array of Independent Disks (RAID), Solid State Disk (SSD), external SATA (eSATA), Personal Computer Memory Card International Association (PCMCIA), Universal Serial Bus (USB), a Secure Digital (SD) card, a mini Secure Digital (mSD) card, a micro Secure Digital (micro SD) card, a Secure Digital High Capacity (SDHC) card, a memory stick card, a Smart Media (SM) card, a Multi-Media Card (MMC), an embedded MMC (eMMC), a Compact Flash (CF) card and the like.

The media processing block 1170 may include a controller for processing the data obtained from the processing of the processor 1100 or data inputted from an external input device and for transferring the processed data to an external interface device in the form of image, voice, and others, such as a Graphic Processing Unit (GPU), a Digital Signal Processor (DSP), a High Definition Audio (HD Audio), a High Definition Multimedia Interface (HDMI) controller, and the like.

In accordance with an embodiment of the present invention, the operation characteristics and integration degree of a non-volatile memory device may be improved by including a selection gate that couples a floating gate, while preventing over-erase.

Additionally, a control plug for coupling the floating gate along with the selection gate, the operation characteristics and integration degree of the non-volatile memory device may be improved more effectively.

Furthermore, as the control plugs are disposed over an isolation layer, the control plugs are free from the polarity of a bias voltage applied thereto. As a result, the size of a peripheral circuit for supplying the bias voltage to memory cells may be decreased and diverse known operation schemes may be performed.

Moreover, the non-volatile memory device may be fabricated without performing an additional process other than a logic process.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
    an isolation layer formed over a substrate to define an active region;
    a floating gate formed over the substrate;
    a selection gate formed over the substrate on one side of the floating gate and formed to be adjacent to the floating gate with a first gap from the floating gate;
    a control plug formed over the isolation layer on the other side of the floating gate and formed to be adjacent to the floating gate with a second gap from the floating gate; and
    a charge blocking layer formed to gap-fill the first gap and the second gap,
    wherein the control plug and the selection gate receive a same bias voltage, and the floating gate is coupled with the control plug and the selection gate, in response to the same bias voltage being applied to the control plug and the selection gate.

2. The non-volatile memory device of claim 1, further comprising:
    an inter-layer dielectric layer formed over the substrate;
    a selection plug formed over the selection gate, wherein the control plug and the selection plug are formed to penetrate through the inter-layer dielectric layer; and
    a conductive line formed over the inter-layer dielectric layer to contact the control plug and the selection plug.

3. The non-volatile memory device of claim 1, wherein the selection gate and the control plug have at least one sidewall that faces a sidewall of the floating gate.

4. The non-volatile memory device of claim 1, wherein the control plug includes at least one sidewall that faces a sidewall of the floating gate.

5. The non-volatile memory device of claim 1, wherein the floating gate and the selection gate simultaneously go across the active region and the isolation layer.

6. The non-volatile memory device of claim 1, wherein a line width of the first gap is the same as or wider than a line width of the second gap.

7. The non-volatile memory device of claim 1, wherein the charge blocking layer is a spacer formed on the sidewalls of the floating gate and the selection gate.

8. The non-volatile memory device of claim 1, further comprising:
    a first junction region formed in the active region adjacent to the floating gate;
    a second junction region formed in the active region adjacent to the selection gate;
    a third junction region formed in the active region under the first gap; and
    a first contact plug formed over the first junction region and a second contact plug formed over the second junction region.

9. The non-volatile memory device of claim 8, wherein a line width between the floating gate and the first contact plug is the same as or wider than a line width of the second gap.

10. The non-volatile memory device of claim 8, wherein an area of the sidewalls of the floating gate and the first contact plug facing each other is greater than an area of the sidewalls of the floating gate and the control plug facing each other.

11. The non-volatile memory device of claim 8, wherein the first and second junction regions include a first impurity region and a second impurity region having a higher impurity doping concentration than that of the first impurity region, and the third junction region includes the first impurity region.

12. A non-volatile memory device, comprising:
    an isolation layer formed over a substrate to define a plurality of active regions;
    a plurality of contact plugs formed over the active regions;
    a first floating gate and a second floating gate formed over the substrate on both sides of one contact plug selected among the contact plugs;
    a first selection gate and a second selection gate formed over the substrate on both sides of the selected contact plug, wherein the first selection gate is formed to be adjacent to the first floating gate with a first gap from the first floating gate and the second selection gate is formed to be adjacent to the second floating gate with the first gap from the second floating gate;
    a first control plug and a second control plug formed over the isolation layer, between the first floating gate and the second floating gate, wherein the first control plug is formed to be adjacent to the first floating gate with a second gap from the first floating gate and the second control plug is formed to be adjacent to the second floating gate with the second gap from the second floating gate and wherein the first control plug and the second control plug are formed to be symmetrical to each other with respect to the selected contact plug; and
    a charge blocking layer formed on the sidewalls of the first floating gate, the second floating gate, the first selection gate, and the second selection gate and formed to gap-fill the first gap and the second gap.

13. The non-volatile memory device of claim 12, wherein the first control plug and the first selection gate receive a same bias voltage, and the first floating gate is coupled with the first control plug and the first selection gate in response to the same bias voltage applied to the first control plug and the first selection gate, and
    the second control plug and the second selection gate receive the same bias voltage, and the second floating gate is coupled with the second control plug and the second selection gate in response to the same bias voltage applied to the second control plug and the second selection gate.

14. The non-volatile memory device of claim 12, wherein the first control plug and the first selection gate receive different bias voltages that are independent from each other, and the first floating gate is coupled with the first control plug and the first selection gate in response to the different bias voltages applied to the first control plug and the first selection gate, and the second control plug and the second selection gate receive the different bias voltages that are independent from each other, and the second floating gate is coupled with the second control plug and the second selection gate in response to the different bias voltages applied to the second control plug and the second selection gate.

15. The non-volatile memory device of claim 12, wherein the first selection gate and the first control plug have at least one sidewall that faces a sidewall of the first floating gate, and the second selection gate and the second control plug have at least one sidewall that faces a sidewall of the second floating gate.

16. The non-volatile memory device of claim 12, wherein the first control plug includes at least one sidewall that faces a sidewall of the first floating gate, and the second control plug includes at least one sidewall that faces a sidewall of the second floating gate.

17. The non-volatile memory device of claim 12, wherein the active regions are of a line type, the first floating gate and the second floating gate are of a bar type, and the first selection gate and the second selection gate are of a line type, wherein the first floating gate, the second floating gate, the first selection gate and the second selection gate simultaneously go across the active regions and the isolation layer.

18. A non-volatile memory device, comprising:

an isolation layer formed over a substrate to define an active region;

a floating gate formed over the substrate;

a selection gate formed over the substrate on one side of the floating gate and formed to be adjacent to the floating gate with a first gap from the floating gate;

a control plug formed over the isolation layer on the other side of the floating gate and formed to be adjacent to the floating gate with a second gap from the floating gate; and a charge blocking layer formed to gap-fill the first gap and the second gap, wherein the control plug and the selection gate receive different bias voltages that are independent from each other, and the floating gate is coupled with the control plug and the selection gate in response to the different bias voltages applied to the control plug and the selection gate.

19. The non-volatile memory device of claim 18, further comprising:

an inter-layer dielectric layer formed over the substrate;

a selection plug formed over the selection gate, wherein the control plug and the selection plug are formed to penetrate through the inter-layer dielectric layer;

a selection line formed over the inter-layer dielectric layer to contact the selection plug; and a control line formed over the inter-layer dielectric layer to contact the control plug.

20. The non-volatile memory device of claim 18, further comprising:

a first junction region formed in the active region adjacent to the floating gate;

a second junction region formed in the active region adjacent to the selection gate;

a third junction region formed in the active region under the first gap; and a first contact plug formed over the first junction region and a second contact plug formed over the second junction region, wherein the first junction region includes a first impurity region, the second junction region includes a second impurity region having a higher impurity doping concentration than that of the first impurity region, and the third junction region includes the first impurity region.

* * * * *